(12) United States Patent
Ko et al.

(10) Patent No.: US 10,748,617 B2
(45) Date of Patent: Aug. 18, 2020

(54) NONVOLATILE MEMORY DEVICE AND METHOD OF OPERATING THE SAME

(71) Applicant: Samsung Electronics Co., Ltd., Suwon-si, Gyeonggi-do (KR)

(72) Inventors: Kui-Han Ko, Seoul (KR); Jin-Young Kim, Seoul (KR); Il-Han Park, Suwon-si (KR); Bong-Soon Lim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/222,038

(22) Filed: Dec. 17, 2018

(65) Prior Publication Data

US 2019/0348122 A1    Nov. 14, 2019

(30) Foreign Application Priority Data

May 14, 2018    (KR) ........................ 10-2018-0054688

(51) Int. Cl.
| | |
|---|---|
| *G11C 8/10* | (2006.01) |
| *G11C 16/04* | (2006.01) |
| *G11C 11/56* | (2006.01) |
| *G11C 16/26* | (2006.01) |
| *G11C 16/08* | (2006.01) |
| *G11C 16/10* | (2006.01) |
| *H01L 27/11582* | (2017.01) |
| *H01L 27/11556* | (2017.01) |

(52) U.S. Cl.
CPC ...... *G11C 16/0483* (2013.01); *G11C 11/5628* (2013.01); *G11C 11/5642* (2013.01); *G11C 16/08* (2013.01); *G11C 16/10* (2013.01); *G11C 16/26* (2013.01); *G11C 11/5671* (2013.01); *H01L 27/11556* (2013.01); *H01L 27/11582* (2013.01)

(58) Field of Classification Search
CPC ........................................................ G11C 8/10
USPC .................................................... 365/185.11
See application file for complete search history.

(56) References Cited

U.S. PATENT DOCUMENTS

| | | |
|---|---|---|
| 7,813,181 B2 | 10/2010 | Cernea |
| 7,876,611 B2 | 1/2011 | Dutta et al. |
| 8,243,517 B2 | 8/2012 | Iwai et al. |
| 8,274,831 B2 | 9/2012 | Mokhlesi et al. |
| 8,472,266 B2 | 6/2013 | Khandelwal et al. |
| 8,730,733 B2 | 5/2014 | Youn |

(Continued)

*Primary Examiner* — Jason Lappas
(74) *Attorney, Agent, or Firm* — Harness, Dickey and Pierce, P.L.C.

(57) ABSTRACT

A method of operating a nonvolatile memory device is provided where the nonvolatile memory device includes a plurality of cell strings, and each cell string includes a plurality of multi-level cells. a voltage of a selected word line is sequentially changed to sequentially have a plurality of read voltages for determining threshold voltage states of the plurality of multi-level cells. A voltage of an adjacent word line adjacent to the selected word line is sequentially changed in synchronization with voltage changing time points of the selected word line. A load of the selected word line is reduced and an operation speed of the nonvolatile memory device is increased by synchronizing the voltage change of the selected word line and the voltage change of the adjacent word line in the same direction.

20 Claims, 27 Drawing Sheets

(56) References Cited

U.S. PATENT DOCUMENTS

| | | | |
|---|---|---|---|
| 8,854,884 B2 * | 10/2014 | Kim | G11C 8/10 365/185.11 |
| 9,245,637 B2 | 1/2016 | Yang et al. | |
| 9,431,062 B2 | 8/2016 | Park et al. | |
| 9,721,652 B2 | 8/2017 | Puthenthermadam et al. | |

* cited by examiner

FIG. 24

|  | S1 | S2 | S3 | S4 | S5 | S6 | S7 | S8 |
|---|---|---|---|---|---|---|---|---|
| BT1 | 1 | 0 | 0 | 0 | 0 | 1 | 1 | 1 |
| BT2 | 1 | 1 | 0 | 0 | 1 | 1 | 0 | 0 |
| BT3 | 1 | 1 | 1 | 0 | 0 | 0 | 0 | 1 |

VR1 VR2 VR3 VR4 VR5 VR6 VR7

US 10,748,617 B2

NONVOLATILE MEMORY DEVICE AND METHOD OF OPERATING THE SAME

CROSS-REFERENCE TO RELATED APPLICATION

This U.S. Non-provisional application claims priority under 35 USC § 119 to Korean Patent Application No. 10-2018-0054688, filed on May 14, 2018, in the Korean Intellectual Property Office (KIPO), the disclosure of which is incorporated by reference in its entirety herein.

BACKGROUND

1. Technical Field

Example embodiments relate generally to semiconductor integrated circuits. For example, at least some example embodiments relate to a nonvolatile memory device and/or method of operating the nonvolatile memory device.

2. Discussion of the Related Art

Semiconductor memory devices for storing data may be classified into volatile memory devices and nonvolatile memory devices. Volatile memory devices, such as dynamic random access memory (DRAM) devices, are typically configured to store data by charging or discharging capacitors in memory cells, and lose the stored data when power is off. Nonvolatile memory devices, such as flash memory devices, may maintain stored data even though power is off. Volatile memory devices are widely used as main memories of various apparatuses, while nonvolatile memory devices are widely used for storing program codes and/or data in various electronic devices, such as computers, mobile devices, etc.

Recently, nonvolatile memory devices of three-dimensional structure such as vertical NAND memory devices have been developed to increase integration degree and memory capacity of the nonvolatile memory devices. Along with increases in the integration degree and memory capacity, loads of signal lines are increased and operation speeds of the memory devices are decreased.

SUMMARY

Some example embodiments may provide a method of operating a nonvolatile memory device capable of increasing an operation speed of the nonvolatile memory device.

Some example embodiments may provide a nonvolatile memory device having an increased operation speed.

According to example embodiments, a method of operating a nonvolatile memory device is provided, the nonvolatile memory device including a plurality of cell strings, each of the plurality of cell strings including a plurality of multi-level cells. In some example embodiments, the method includes sequentially changing, at voltage changing time points, a voltage level of a selected word line to different ones of a plurality of read voltages; and sequentially changing a voltage level of an adjacent word line in synchronization with the voltage changing time points of the selected word line, the adjacent word line being adjacent to the selected word line.

According to example embodiments, a nonvolatile memory device includes at least one memory block including a plurality of cell strings, each of the plurality of cell strings including a plurality of multi-level cells; and a control circuit configured to control a read operation such that, a voltage level of a selected word line is sequentially changed, at voltage changing time points, to have different ones of a plurality of read voltages, and a voltage level of an adjacent word line is sequentially changed in synchronization with the voltage changing time points of the selected word line, the adjacent word line being adjacent to the selected word line.

According to example embodiments, a method of operating a nonvolatile memory device is provided, the nonvolatile memory device including a plurality of cell strings, each of the plurality of cell strings including a plurality of multi-level cells disposed in a vertical direction. In some example embodiments, the method includes performing a program operation by applying a program voltage in one of a downward direction from an uppermost word line and an upward direction from a lowest word line; sequentially changing, at voltage changing time points, a voltage level of a selected word line to different ones of a plurality of verification read voltages to determine threshold voltage states of the plurality of multi-level cells after the program voltage is applied to the selected word line; and sequentially changing a voltage level of an adjacent word line in synchronization with the voltage changing time points of the selected word line, the adjacent word line being adjacent in the downward direction or in the upward direction to the selected word line.

The nonvolatile memory device and the method of operating the nonvolatile memory device according to example embodiments may reduce a load of the selected word line by synchronizing the voltage change of the selected word line and the voltage change of the adjacent word line in the same direction such that the voltage of the adjacent word line is increased when the voltage of the selected word line is increased and/or the voltage of the adjacent word line is decreased when the voltage of the selected word line is decreased. Through the reduction of the load of the selected word line, a voltage setup time of the selected word line may be reduced and an operation speed of the nonvolatile memory device may be increased.

BRIEF DESCRIPTION OF THE DRAWINGS

Example embodiments of the present disclosure will be more clearly understood from the following detailed description taken in conjunction with the accompanying drawings.

FIGS. 24 and 25 are diagrams illustrating a read sequence for a nonvolatile memory device according to example embodiments.

DETAILED DESCRIPTION

Figure 1:
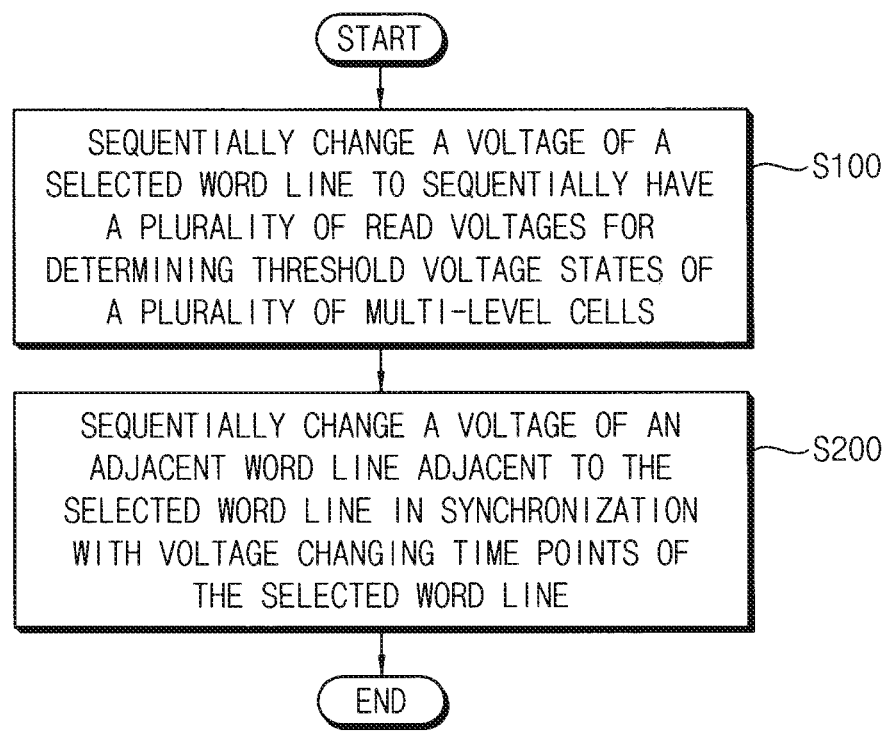
FIG. 1 is a flow chart illustrating a method of operating a nonvolatile memory device.

Various example embodiments will be described more fully hereinafter with reference to the accompanying drawings, in which some example embodiments are shown. In the drawings, like numerals refer to like elements throughout. The repeated descriptions may be omitted.

FIG. 1 is a flow chart illustrating a method of operating a nonvolatile memory device.

FIG. 1 illustrates a method of operating a nonvolatile memory device including a plurality of cell strings, where each cell string includes a plurality of multi-level cells. According to example embodiments, the nonvolatile memory device may include a three-dimensional NAND flash memory device or a vertical NAND flash memory device.

Referring to FIG. 1, in operation S100, a control circuit 450 of a non-volatile memory device 30 (see FIGS. 8 and 9) may sequentially change a voltage of a selected word line such that the selected word line may sequentially have a plurality of read voltages for determining threshold voltage states of the plurality of multi-level cells.

In some example embodiments, the method of operating the nonvolatile memory device may correspond to a program method. In this case, as will be described below with reference to FIG. 3, the plurality of read voltages may correspond to a plurality of verification read voltages that are applied to the selected word line after a program voltage is applied to the selected word line during a program operation. In other example embodiments, the method of operating the nonvolatile memory device may correspond to a normal read method. In this case, as will be described below with reference to FIGS. 25 and 26, the plurality of read voltages correspond to a plurality of normal read voltages that are applied to the selected word line during a normal read operation.

In operation S200, the control circuit 450 may sequentially change a voltage of an adjacent word line adjacent to the selected word line in synchronization with voltage changing time points of the selected word line. As will be described below with reference to FIGS. 5 and 6, the voltage of the adjacent word line may be changed in the same direction as a voltage change direction of the selected word line such that a capacitance by capacitive coupling between the selected word line and the adjacent word line may be decreased.

In some example embodiments, the adjacent word line may include at least one word line that is adjacent to the selected word line in one direction. In other example embodiments, the adjacent word line may include at least one word line that is adjacent to the selected word line in a first direction and at least one word line that is adjacent to the selected word line in a second direction opposite to the first direction.

Conventionally, the voltage of the adjacent word line may be maintained at a fixed voltage level when the voltage of the selected word line is sequentially changed to sequentially have the plurality of read voltages. In contrast, in the nonvolatile memory device and the method of operating the nonvolatile memory device according to example embodiments, the voltage change of the selected word line is synchronized with voltage change of the adjacent word line in the same direction so as to reduce the load of the selected word line. Through the reduction of the load of the selected word line, the voltage setup time of the selected word line may be reduced and the operation speed of the nonvolatile memory device may be increased.

Figure 2:
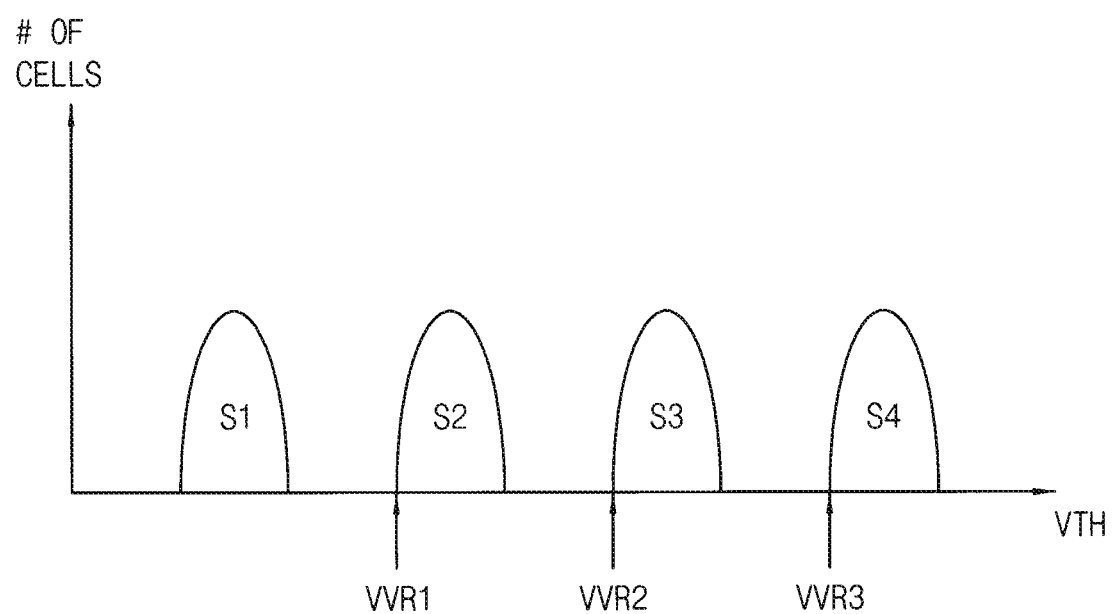
FIGS. 2 and 3 are diagrams illustrating an example of a program operation of a nonvolatile memory device.
Figure 3:
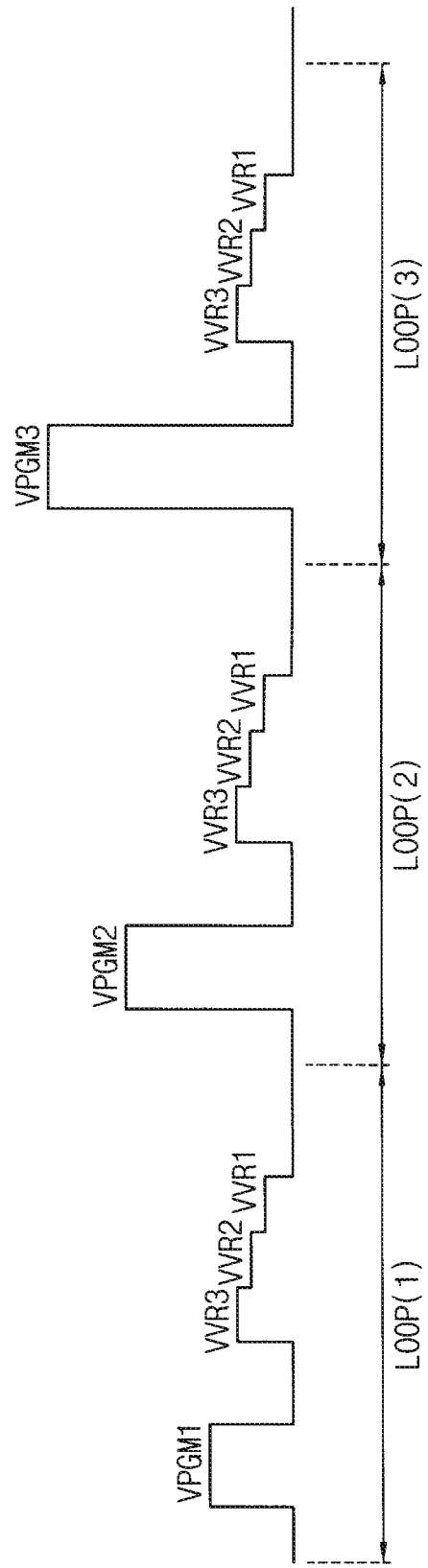

FIGS. 2 and 3 are diagrams illustrating an example of a program operation of a nonvolatile memory device.

FIG. 2 illustrates first through fourth states S1~S4 of multi-level cells that may store two bits of data respectively. In FIG. 2, the horizontal axis represents a threshold voltage VTH of the multi-level cell and the vertical axis represents the number of multi-level cells corresponding to the threshold voltage VTH. The result of the programming the first through fourth states S1~S4 may be determined by sequentially applying first, second and third verification read voltages VVR1, VVR2 and VVR3.

FIG. 3 illustrates a plurality of program loops for an incremental step pulse programming (ISPP).

Referring to FIGS. 2 and 3, a plurality of program loops LOOP(1), LOOP(2) and LOOP(3) may be performed sequentially according to ISPP until the program operation is completed. As the program loops are repeated, the program voltages VPGM1, VPGM2 and VPGM3 may be increased sequentially.

Each program loop LOO(i) may include a program period to apply each of the program voltages VPGM1, VPGM2 and VPGM3 to a selected word line for programming the selected memory cells and a verification period to apply verification read voltages VVR1, VVR2 and VVR3 to the selected word line for verifying the success of the program operation. FIG. 3 illustrates a non-limiting example that the verification read voltages VVR1, VVR2 and VVR3 are applied in a decreasing order. In some example embodiments, the verification read voltages VVR1, VVR2 and VVR3 may be applied in an increasing order. Even though the multi-level cells storing two bits of data have been described for convenience of illustration and description, the example embodiment may be applied to the multi-level cells storing three or more bits of data.

Figure 4:
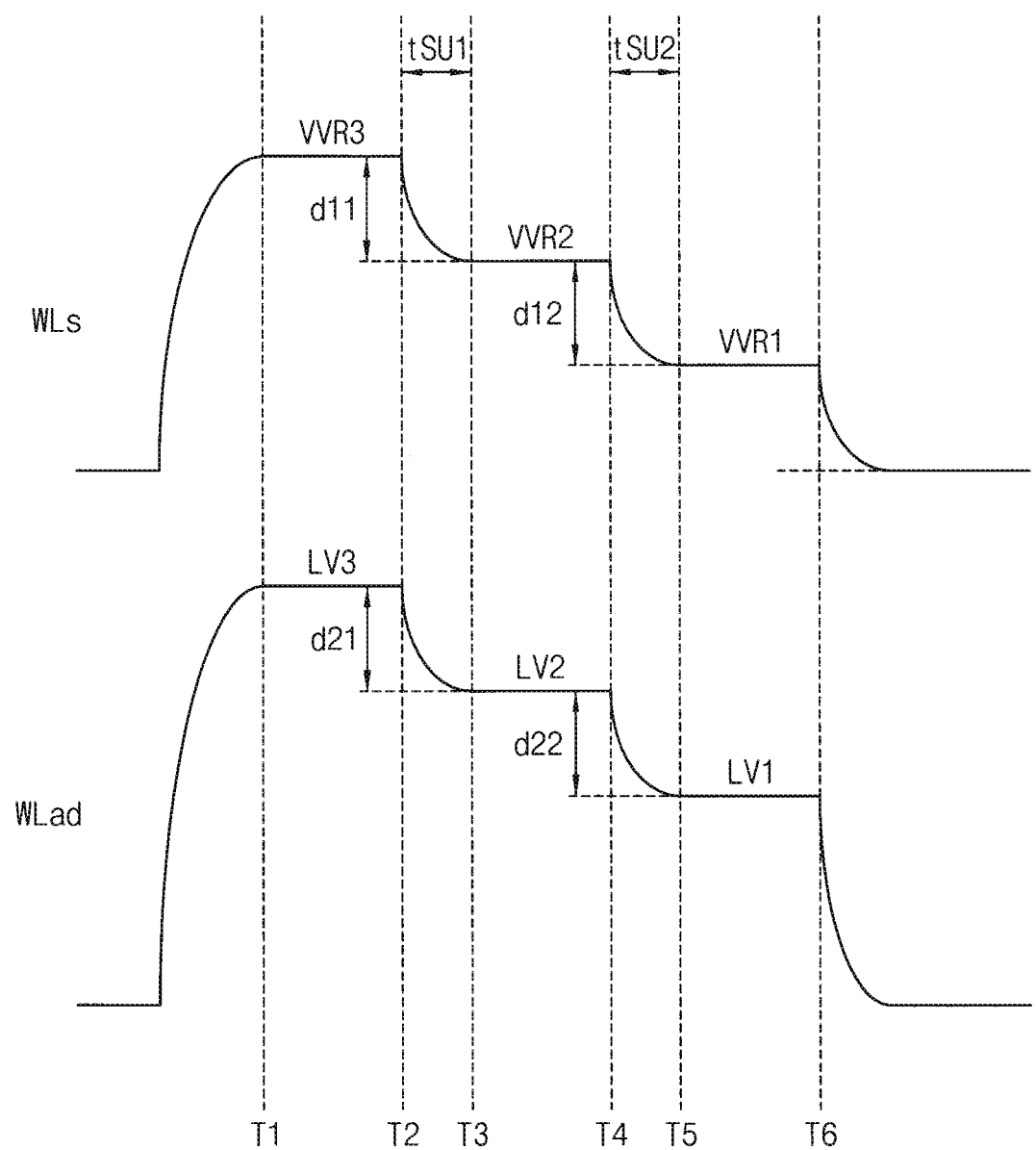
FIG. 4 is a timing diagram illustrating a method of operating a nonvolatile memory device according to example embodiments.

FIG. 4 is a timing diagram illustrating a method of operating a nonvolatile memory device according to example embodiments.

Referring to FIGS. 2, 3 and 4, the third verification read voltage VVR3 may be applied to the selected word line WLs to perform a third sensing operation during a time interval T1~T2, the second verification read voltage VVR2 may be applied to the selected word line WLs to perform a second sensing operation during a time interval T3~T4, and the first verification read voltage VVR1 may be applied to the selected word line WLs to perform a first sensing operation during a time interval T5~T6. For such sequential sensing operations, the voltage of the selected word line WLs may be decreased from an (L+1)-th read voltage for an (L+1)-th sensing operation to an L-th read voltage for an L-th sensing operation lower than the (L+1)-th read voltage, where L is a positive integer.

According to example embodiments, the voltage of the adjacent word line WLad may be decreased from an (L+1)-th voltage level to an L-th voltage level lower than the (L+1)-th voltage level when the voltage of the selected word line WLs is decreased from the (L+1)-th read voltage to the L-th read voltage. In other words, as illustrated in FIG. 4, the voltage of the adjacent word line WLad may be decreased from a third voltage level LV3 to a second voltage level LV2 at a time point T2 when the voltage of the selected word line WLs is decreased from the third read voltage VVR3 to the second read voltage VVR2, and the voltage of the adjacent word line WLad may be decreased from the second voltage level LV2 to a first voltage level LV1 at a time point T4 when the voltage of the selected word line WLs is decreased from the second read voltage VVR2 to the first read voltage VVR1.

In some example embodiments, the voltage of the adjacent word line WLad may be decreased such that a difference between the (L+1)-th read voltage and the (L+1)-th voltage level is equal to a difference between the L-th read voltage and the L-th voltage level. In other words, as illustrated in FIG. 4, the difference d21 between the third voltage level LV3 and the second voltage level LV2 may be set to be equal to the difference d11 between the third read voltage VVR3 and the second read voltage VVR2, and the difference d22 between the second voltage level LV2 and the first voltage level LV1 may be set to be equal to the difference d12 between the second read voltage VVR2 and the first read voltage VVR1.

As such, the load of the selected word line WLs may be reduced by synchronizing the voltage change of the selected word line WLs and the voltage change of the adjacent word line WLad in the same direction. As a result, voltage setup times tSU1 and tSU2 of the selected word line WLs may be decreased through the reduction of the load of the selected word line WLs.

Figure 5:
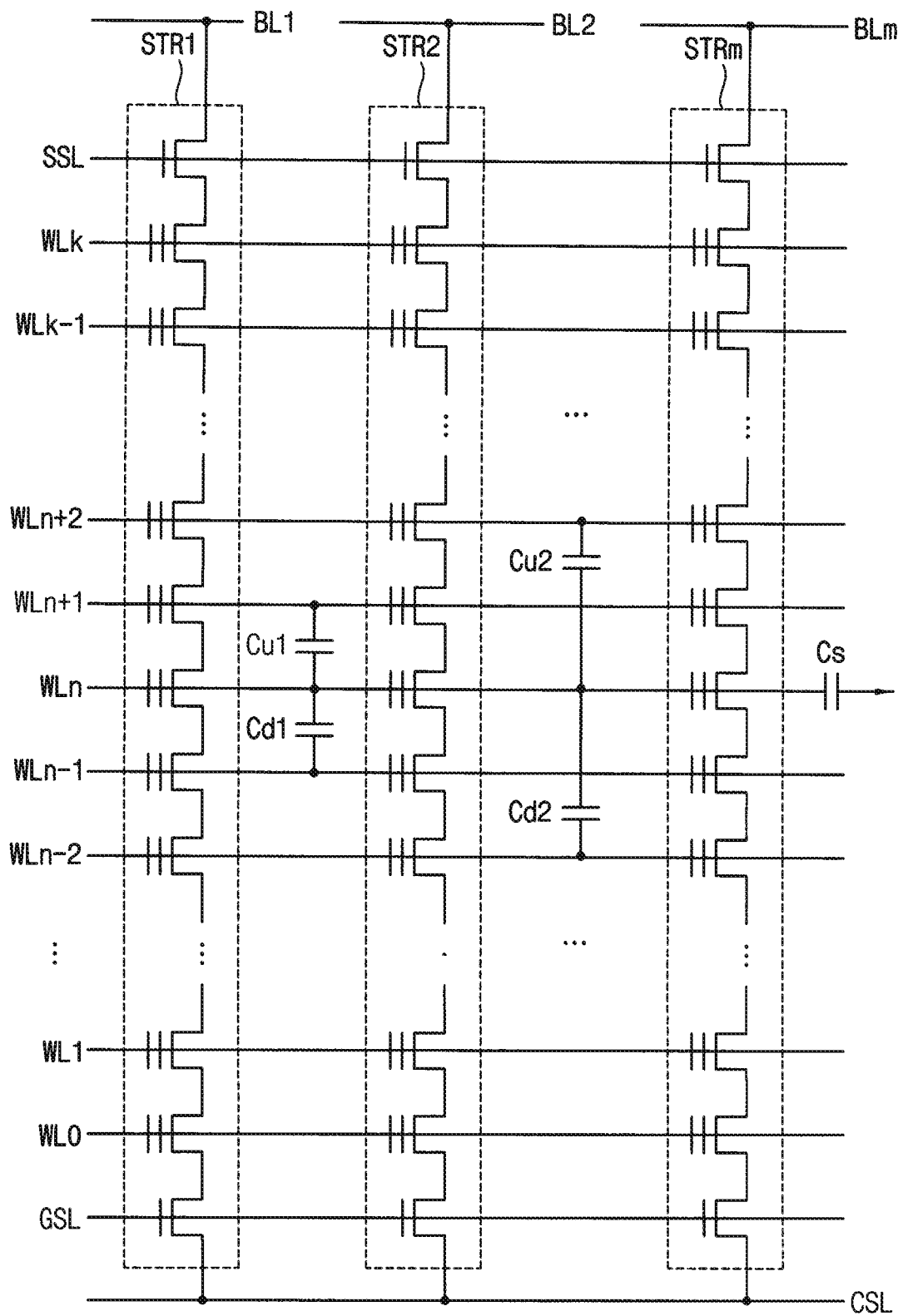
FIGS. 5 and 6 are diagrams for describing a reduction of a voltage setup time of a selected word line in a nonvolatile memory device according to example embodiments.
Figure 6:
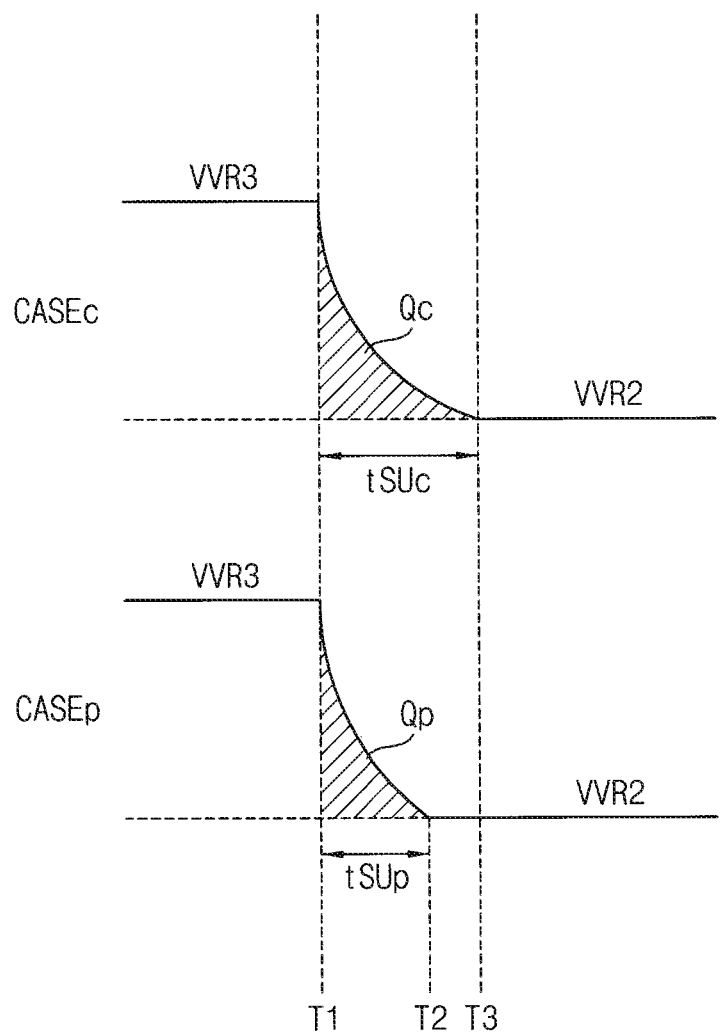

FIGS. 5 and 6 are diagrams for describing a reduction of a voltage setup time of a selected word line in a nonvolatile memory device according to example embodiments.

FIG. 5 illustrates two-dimensional version of a memory block including NAND strings or cell strings STR1~STRm connected to bit lines BL1~BLm and one common source line CSL for convenience of illustration, but it will be understood that the memory block may have a three-dimensional structure as will be described below with reference to FIGS. 11 and 12.

Referring to FIG. 5, the cell strings STR1~STRm may include string selection transistors controlled by a string selection line SSL memory cells controlled by word lines WL0~WLk, and ground selection transistors controlled by a ground selection line GSL, respectively.

If the word line WLn is the selected word line, the selected word line WLs may have a load including a self-capacitance Cs, mutual capacitances Cu1 and Cu2 by capacitive coupling with the adjacent word lines WLn+1 and WLn+2 that are adjacent to the selected word line WLs in a first direction (that is, an upward direction) and mutual capacitances Cd1 and Cd2 by capacitive coupling with the adjacent word lines WLn−1 and WLn−2 that are adjacent to the selected word line WLs in a second direction (that is, a downward direction) opposite to the first direction. According to example embodiments, the mutual capacitances contributing the load of the selected word line WLn may be reduced and thus the voltage setup time of the selected word line WLn may be reduced by controlling the voltages of the adjacent word lines WLn+1, WLn−1, WLn+2 and WLn−2. In some example embodiments, the mutual capacitances Cu1 and Cd1 of the word lines WLn+1 and WLn−1 directly adjacent to the selected word line WLn may be considered. In other example embodiments, also the mutual capacitances Cu2 and Cd2 of the word lines WLn+2 and WLn−2 having less influence on the load of the selected word line WLn may be considered in addition to the mutual capacitances Cu1 and Cd1.

FIG. 6 illustrates voltage setup times tSUc and tSUp for a case that the voltage of the selected word line is decreased from the third verification read voltage VVR3 to the second verification read voltage VVR2. A first case CASEc corresponds to a case when the voltage of the adjacent word line is fixed and a second case CASEp corresponds to a case when the voltage of the adjacent word line is changed in synchronization with the voltage change of the selected word line according to example embodiments. The hatched areas in FIG. 6 indicate amounts of charges Qc and Qp that are discharged from the selected word line when the voltage of the selected word line is decreased. As illustrated in FIG. 6, the charge Qp of the second case CASEp is decreased compared with the charge Qc of the first case CASEc according to the reduction of the mutual capacitance with the adjacent word line and thus the voltage setup time tSUp of the second case CASEp may be decreased compared with the voltage setup time tSUc of the first case CASEc.

Figure 7:
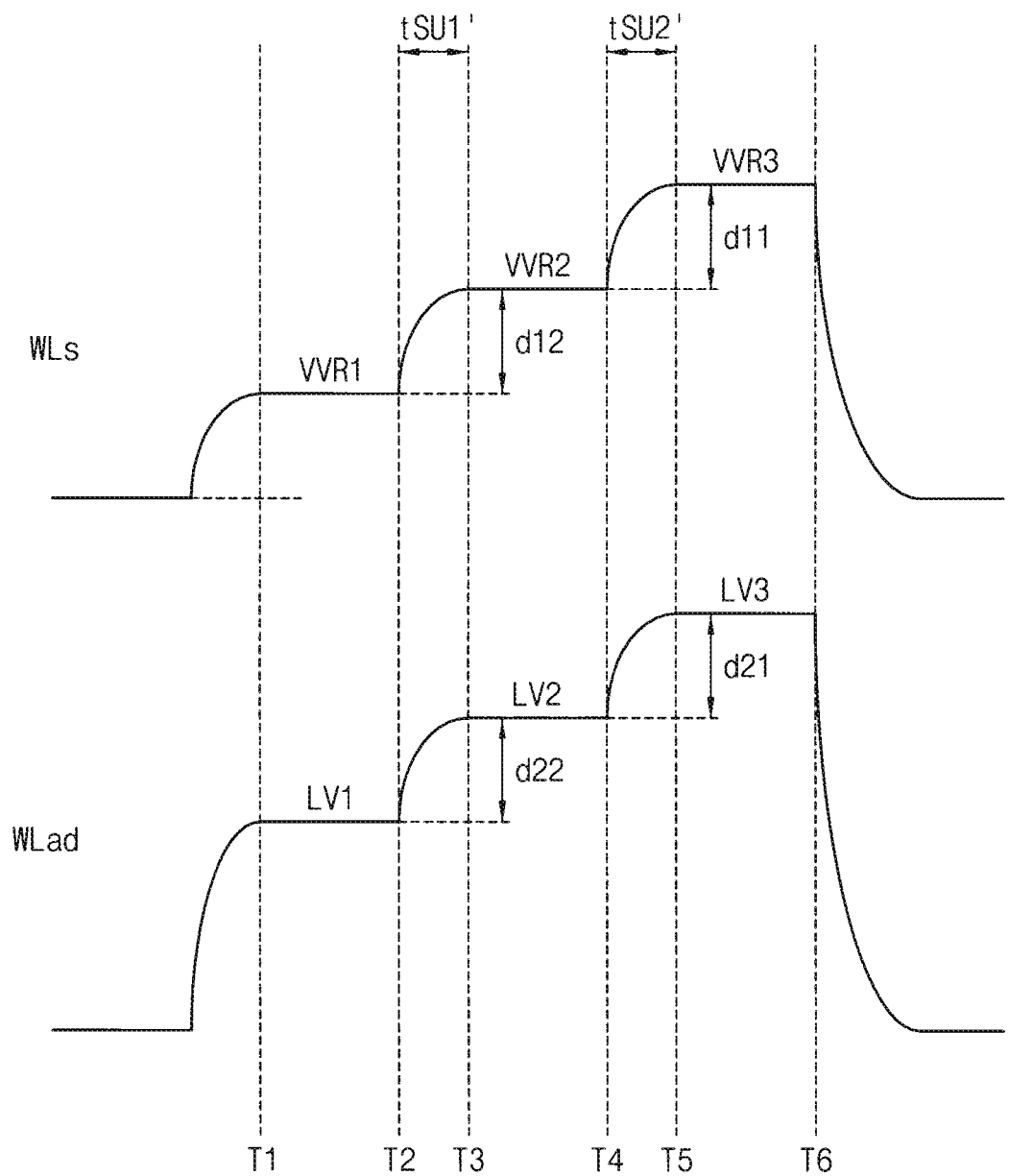
FIG. 7 is a timing diagram illustrating a method of operating a nonvolatile memory device according to example embodiments.

FIG. 7 is a timing diagram illustrating a method of operating a nonvolatile memory device according to example embodiments.

Referring to FIGS. 2, 3 and 7, the first verification read voltage VVR1 may be applied to the selected word line WLs to perform the first sensing operation during a time interval T1~T2, the second verification read voltage VVR2 may be applied to the selected word line WLs to perform the second sensing operation during a time interval T3~T4, and the third verification read voltage VVR3 may be applied to the selected word line WLs to perform the third sensing operation during a time interval T5~T6. For such sequential sensing operations, the voltage of the selected word line WLs may be increased from an L-th read voltage for an L-th sensing operation to an (L+1)-th read voltage for an (L+1)-th sensing operation higher than the L-th read voltage, where L is a positive integer.

According to example embodiments, the voltage of the adjacent word line WLad may be increased from an L-th voltage level to an (L+1)-th voltage level higher than the L-th voltage level when the voltage of the selected word line WLs is increased from the L-th read voltage to the (L+1)-th read voltage. In other words, as illustrated in FIG. 7, the voltage of the adjacent word line WLad may be increased from the first voltage level LV1 to the second voltage level LV2 at a time point T2 when the voltage of the selected word line WLs is increased from the first read voltage VVR1 to the second read voltage VVR2, and the voltage of the adjacent word line WLad may be increased from the second voltage level LV2 to the third voltage level LV3 at a time point T4 when the voltage of the selected word line WLs is increased from the second read voltage VVR2 to the third read voltage VVR3.

In some example embodiments, the voltage of the adjacent word line WLad may be increased such that a difference between the L-th read voltage and the L-th voltage level is equal to a difference between the (L+1)-th read voltage and the (L+1)-th voltage level. In other words, as illustrated in FIG. 7, the difference d22 between the second voltage level LV2 and the first voltage level LV1 may be set to be equal to the difference d12 between the second read voltage VVR2 and the first read voltage VVR1, and the difference d21 between the third voltage level LV3 and the second voltage level LV2 may be set to be equal to the difference d11 between the third read voltage VVR3 and the second read voltage VVR2.

As such, the load of the selected word line WLs may be reduced by synchronizing the voltage change of the selected word line WLs and the voltage change of the adjacent word line WLad in the same direction. As a result, voltage setup times tSU1 and tSU2 of the selected word line WLs may be decreased through the reduction of the load of the selected word line WLs.

Figure 8:
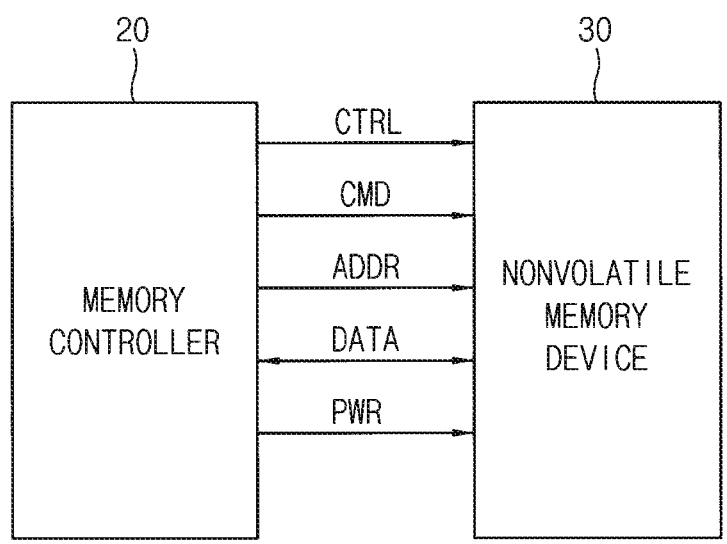
FIG. 8 is a block diagram illustrating a memory system according to example embodiments.

FIG. 8 is a block diagram illustrating a memory system according to example embodiments.

Referring to FIG. 8, a memory system 10 may include a memory controller 20 and at least one memory device 30.

The memory device 30 may be a nonvolatile memory device as described herein. The memory system 10 may include data storage media based on flash memory such as a memory card, a universal serial bus (USB) memory and solid state drive (SSD).

The nonvolatile memory device 30 may perform a read operation, an erase operation, and a program operation or a write operation under control of the memory controller 20. The nonvolatile memory device 30 receives a command CMD, an address ADDR and data DATA through input/output lines from the memory controller 20 for performing such operations. In addition, the nonvolatile memory device 30 receives a control signal CTRL through a control line from the memory controller 20. In addition, the nonvolatile memory device 30 receives a power PWR through a power line from the memory controller 20.

Figure 9:
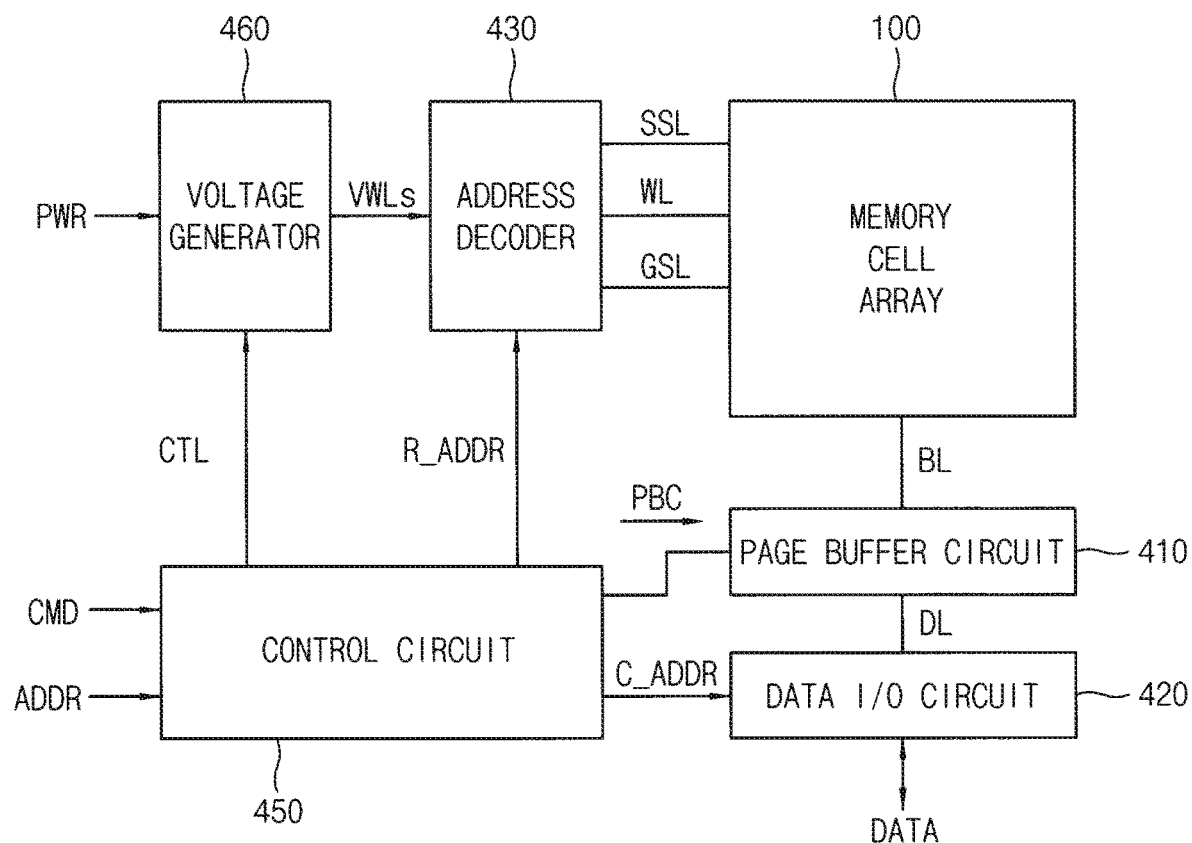
FIG. 9 is a block diagram illustrating a nonvolatile memory device according to example embodiments.

FIG. 9 is a block diagram illustrating a nonvolatile memory device according to example embodiments.

Referring to FIG. 9, the nonvolatile memory device 30 includes a memory cell array 100, a page buffer circuit 410, a data input/output circuit 420, an address decoder 430, a control circuit 450 and a voltage generator 460.

The memory cell array 100 may be coupled to the address decoder 430 through a plurality of string selection lines SSL, a plurality of word lines WL, and a plurality of ground selection lines GSL. In addition, the memory cell array 100 may be coupled to the page buffer circuit 410 through a plurality of bit lines BL.

The memory cell array 100 may include a plurality of memory cells coupled to the plurality of word lines WL and the plurality of bit lines BL. In some example embodiments, the memory cell array 100 may be a three-dimensional memory cell array, which is formed on a substrate in a three-dimensional structure (or a vertical structure). In this case, the memory cell array 100 may include a plurality of NAND strings that are vertically oriented such that at least one memory cell is located over another memory cell.

The control circuit 450 may receive a command (signal) CMD and an address (signal) ADDR from the memory controller 20 and control erasure, programming and read operations of the nonvolatile memory device 30 based on the command signal CMD and the address signal ADDR. An erasure operation may comprise performing a sequence of erase loops, and a program operation may include performing a sequence of program loops. Each program loop may include a program period and a program verification period. Each erase loop may include an erase period and an erase verification period. The read operation may include a normal read operation and data recover read operation.

For example, the control circuit 450 may generate the control signals CTL, which are used for controlling the voltage generator 460, and may generate the page buffer control signal PBC for controlling the page buffer circuit 410, based on the command signal CMD, and generate the row address R_ADDR and the column address C_ADDR based on the address signal ADDR. The control circuit 450 may provide the row address R_ADDR to the address decoder 430 and provide the column address C_ADDR to the data input/output circuit 420.

The address decoder 430 may be coupled to the memory cell array 100 through the plurality of string selection lines SSL, the plurality of word lines WL, and the plurality of ground selection lines GSL. During the program operation or the read operation, the address decoder 430 may determine one of the plurality of word lines WL as a selected word line and determine rest of the plurality of word lines WL except for the selected word line as unselected word lines based on the row address R_ADDR.

In addition, during the program operation or the read operation, the address decoder 430 may determine one of the plurality of string selection lines SSL as a selected string selection line and determine rest of the plurality of string selection lines SSL except for the selected string selection line as unselected string selection lines based on the row address R_ADDR.

The voltage generator 460 may generate word line voltages VWL, which are required for the operation of the memory cell array 100 of the nonvolatile memory device 30, based on the control signals CTL. The voltage generator 460 may receive the power PWR from the memory controller 20. The word line voltages VWL may be applied to the plurality of word lines WL through the address decoder 430.

For example, during the program operation, the voltage generator 460 may apply a program voltage to the selected word line and may apply a program pass voltage to the unselected word lines. In addition, during the program verification operation, the voltage generator 460 may apply a program verification voltage to the first word line and may apply a verification pass voltage to the unselected word lines.

In addition, during the normal read operation, the voltage generator 460 may apply a read voltage to the selected word line and may apply a read pass voltage to the unselected word lines. During the data recover read operation, the voltage generator 460 may apply the read voltage to a word line adjacent to the selected word line and may apply a recover read voltage to the selected word line.

The page buffer circuit 410 may be coupled to the memory cell array 100 through the plurality of bit lines BL. The page buffer circuit 410 may include a plurality of buffers. In some example embodiments, each buffer may be connected to only one bit line. In other example embodiments, each buffer may be connected to two or more bit lines.

The page buffer circuit 410 may temporarily store data to be programmed in a selected page or data read out from the selected page of the memory cell array 100.

The data input/output circuit 420 may be coupled to the page buffer circuit 410 through data lines DL. During the program operation, the data input/output circuit 410 may receive program data DATA received from the memory controller 20 and provide the program data DATA to the page buffer circuit 410 based on the column address C_ADDR received from the control circuit 450. During the read operation, the data input/output circuit 420 may provide read data DATA, having been read from the memory cell array 100 and stored in the page buffer circuit 410, to the memory controller 20 based on the column address C_ADDR received from the control circuit 450.

In addition, the page buffer circuit 410 and the data input/output circuit 420 may read data from a first area of the memory cell array 100 and write this read data to a second area of the memory cell array 100 (e.g., without transmitting the data to a source external to the nonvolatile memory device 30, such as to the memory controller 20). That is, the page buffer circuit 410 and the data input/output circuit 420 may perform a copy-back operation.

Figure 10:
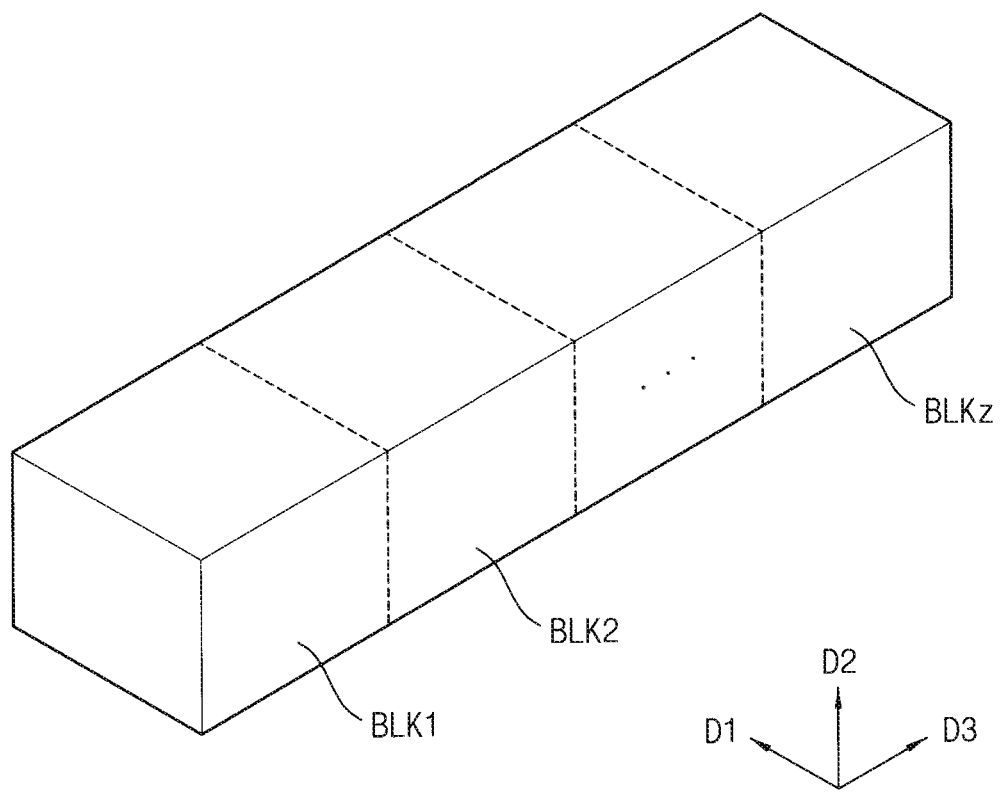
FIG. 10 is a block diagram illustrating a memory cell array included in the nonvolatile memory device of FIG. 9.
Figure 11:
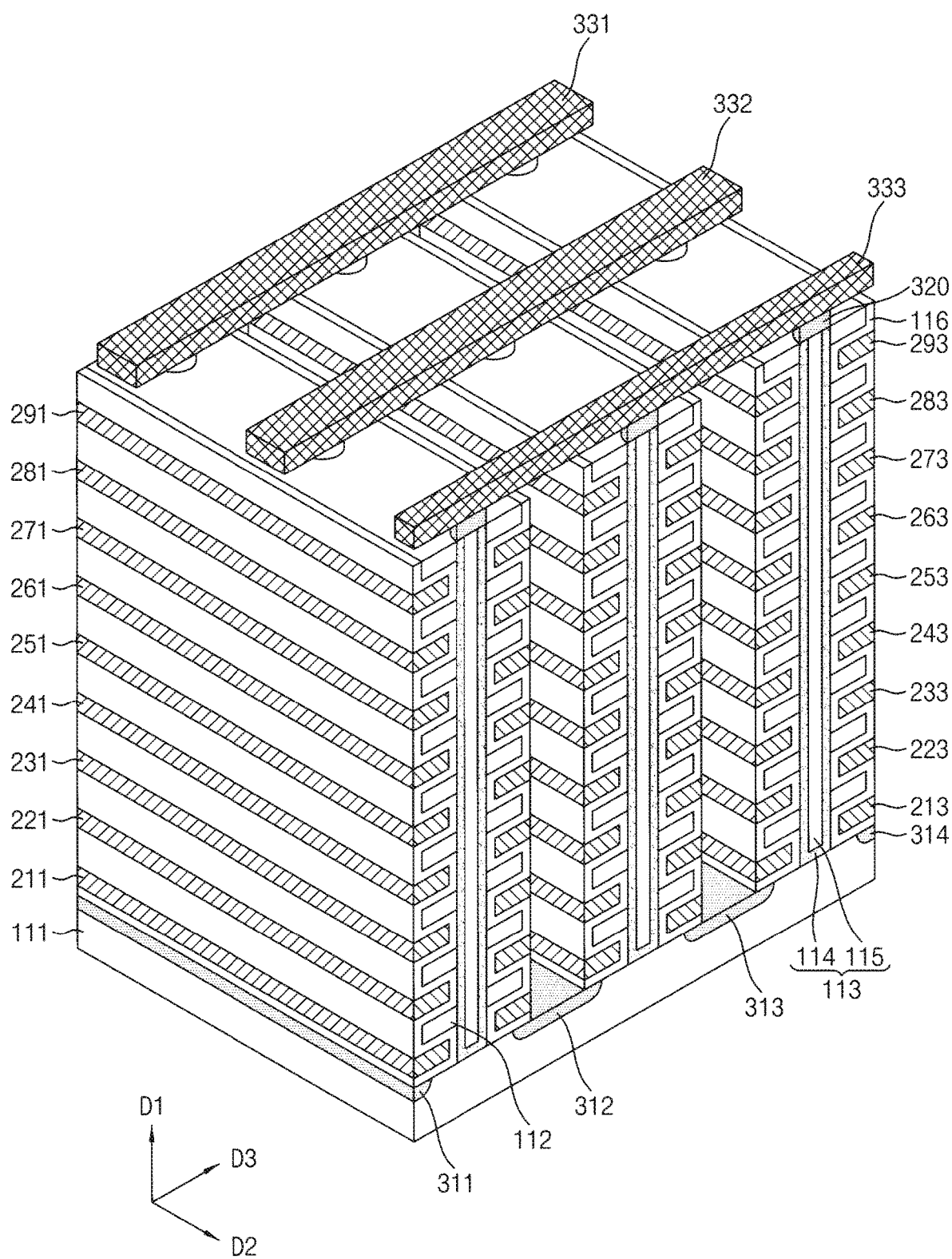
FIG. 11 is a perspective view illustrating one of memory blocks of FIG. 10.

FIG. 10 is a block diagram illustrating a memory cell array included in the nonvolatile memory device of FIG. 9, and FIG. 11 is a perspective view illustrating one of memory blocks of FIG. 10.

Referring to FIG. 10, the memory cell array 100 may include a plurality of memory blocks BLK1 to BLKz. In an example embodiment, the memory blocks BLK1 to BLKz are selected by the address decoder 430 in FIG. 9. For example, the address decoder 430 may select a particular memory block BLK corresponding to a block address among the memory blocks BLK1 to BLKz.

Hereinafter, a first direction D1 indicates a direction perpendicular to an upper surface of a semiconductor substrate, and a second direction D2 and a third direction D3 indicate two directions parallel to the upper surface of the semiconductor substrate. For example, the second direction and the third direction D3 may be perpendicular to each other. The first direction D1 may be referred to as a vertical direction, the second direction D2 may be referred to as a row direction and the third direction D3 may be referred to as a column direction. The direction indicated by an arrow in figures and the opposite direction may be considered as the same direction.

Referring to FIG. 11, a memory block BLKi includes NAND strings or cell strings which are formed on a substrate in a three-dimensional structure (or a vertical structure). The memory block BLKi includes structures extending along the first, second and third directions D1, D2 and D3.

A substrate 111 is provided. For example, the substrate 111 may have a well of a first type (e.g., a first conductive type). For example, the substrate 111 may have a p-well formed by implanting a group 3 element such as boron (B). For example, the substrate 111 may have a pocket p-well provided in an n-well. In an example embodiment, the substrate 111 has a p-type well (or a p-type pocket well). However, the conductive type of the substrate 111 is not limited to the p-type.

A plurality of doping regions 311 to 314 extending along the first direction D1 are provided in/on the substrate 111. For example, the plurality of doping regions 311 to 314 may have a second type (e.g., a second conductive type) different from the first type of the substrate 111. In an example embodiment, the first to fourth doping regions 311 to 314 have an n-type. However, the conductive type of the first to fourth doping regions 311 to 314 is not limited to the n-type.

A plurality of insulation materials 112 extending along the first direction D1 are sequentially provided along the second direction D2 on a region of the substrate 111 between the first and second doping regions 311 and 312. For example, the plurality of insulation materials 112 are provided along the second direction D2, being spaced by a specific distance. For example, the insulation materials 112 may include an insulation material such as an oxide layer.

A plurality of pillars 113 penetrating the insulation materials along the second direction D2 are sequentially disposed along the first direction D1 on a region of the substrate 111 between the first and second doping regions 311 and 312. For example, the plurality of pillars 113 penetrate the insulation materials 112 to contact the substrate 111.

For example, each pillar 113 may include a plurality of materials. For example, a channel layer 114 of each pillar 113 may include a silicon material having a first type. For example, the channel layer 114 of each pillar 113 may include a silicon material having the same type as the substrate 111. In an example embodiment, the channel layer 114 of each pillar 113 includes a p-type silicon. However, the channel layer 114 of each pillar 113 is not limited to the p-type silicon.

An internal material 115 of each pillar 113 includes an insulation material. For example, the internal material 115 of each pillar 113 may include an insulation material such as a silicon oxide. In some examples, the inner material 115 of each pillar 113 may include an air gap.

An insulation layer 116 is provided along the exposed surfaces of the insulation materials 112, the pillars 113, and the substrate 111, on a region between the first and second doping regions 311 and 312.

A plurality of first conductive materials 211 to 291 are provided on surfaces of the insulation layer 116, in a region between the first and second doping regions 311 and 312. For example, the first conductive material 211 extending along the second direction D2 is provided between the insulation material 112 adjacent to the substrate 111 and the substrate 111. In more detail, the first conductive material 211 extending along the second direction D2 is provided between the insulation layer 116 at the bottom of the insulation material 112 adjacent to the substrate 111 and the substrate 111.

A first conductive material extending along the second direction D2 is provided between the insulation layer 116 at the top of the specific insulation material among the insulation materials 112 and the insulation layer 116 at the bottom of a specific insulation material among the insulation materials 112. For example, a plurality of first conductive materials 221 to 281 extending along the second direction D2 are provided between the insulation materials 112 and it may be understood that the insulation layer 116 is provided between the insulation materials 112 and the first conductive materials 221 to 281. The first conductive materials 211 to 291 may be formed of a conductive metal. In some examples, the first conductive materials 211 to 291 may include a conductive material such as a polysilicon.

The same structures as those on the first and second doping regions 311 and 312 may be provided in a region between the second and third doping regions 312 and 313. In the region between the second and third doping regions 312 and 313, provided are a plurality of insulation materials 112 extending along the second direction D2, a plurality of pillars 113 disposed sequentially along the second direction D2 and penetrating the plurality of insulation materials 112 along the first direction D1, an insulation layer 116 provided on the exposed surfaces of the plurality of insulation materials 112 and the plurality of pillars 113, and a plurality of conductive materials 213 to 293 extending along the second direction D2.

Drains 320 are provided on the plurality of pillars 113, respectively. On the drains, the second conductive materials 331 to 333 extending along the third direction D3 are provided. The second conductive materials 331 to 333 are disposed along the second direction D2, being spaced by a specific distance. The second conductive materials 331 to 333 are respectively connected to the drains 320 in a corresponding region. The drains 320 and the second conductive material 333 extending along the third direction D3 may be connected through each contact plug. The second conductive materials 331 to 333 may include metal materials. The second conductive materials 331 to 333 may include conductive materials such as a polysilicon.

The layers in which the first conductive materials are formed correspond to gate layers and the first conductive materials may from gate lines such as a string selection line SSL, a word line WL, intermediate switching lines MSL, USL and LSL, a ground selection line GSL, etc. The second conductive materials may from a bit line BL.

Figure 12:
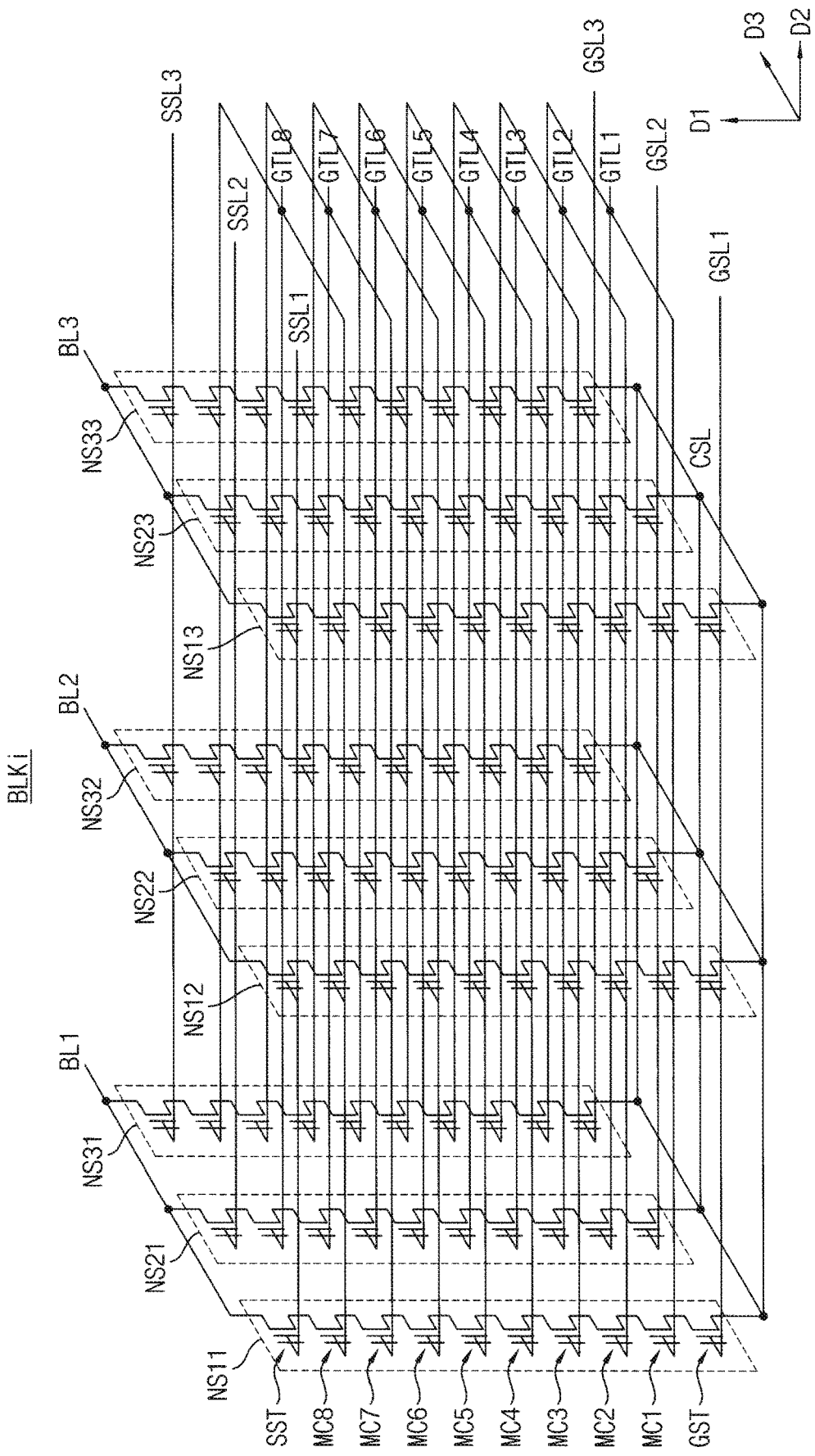
FIG. 12 is a circuit diagram illustrating an equivalent circuit of the memory block described with reference to FIG. 11.

FIG. 12 is a circuit diagram illustrating an equivalent circuit of the memory block described with reference to FIG. 11.

The memory block BLKi of FIG. 12 may be formed on a substrate in a three-dimensional structure (or a vertical structure). For example, a plurality of NAND strings or cell strings included in the memory block BLKi may be formed in the first direction D1 perpendicular to the upper surface of the substrate.

Referring to FIG. 12, the memory block BLKi may include NAND strings NS11 to NS33 coupled between bit lines BL1, BL2 and BL3 and a common source line CSL. Each of the NAND strings NS11 to NS33 may include a string selection transistor SST, a plurality of memory cells MC1 to MC8, and a ground selection transistor GST. In FIG. 12, each of the NAND strings NS11 to NS33 is illustrated to include eight memory cells MC1 to MC8. However, example embodiments are not limited thereto. In some example embodiments, each of the NAND strings NS11 to NS33 may include any number of memory cells.

Each string selection transistor SST may be connected to a corresponding string selection line (one of SSL1 to SSL3). The plurality of memory cells MC1 to MC8 may be connected to corresponding gate lines GTL1 to GTL8, respectively. The gate lines GTL1 to GTL8 may be word lines and some of the gate lines GTL1 to GTL8 may be dummy word lines. In addition, some of the gate lines GTL1 to GTL8 may be intermediate switching lines and the memory cells connected to the intermediate switching lines may be referred to as intermediate switching transistors. Each ground selection transistor GST may be connected to a corresponding ground selection line (one of GSL1 to GSL3). Each string selection transistor SST may be connected to a corresponding bit line (e.g., one of BL1, BL2 and BL3), and each ground selection transistor GST may be connected to the common source line CSL.

Word lines (e.g., WL1) having the same height may be commonly connected, and the ground selection lines GSL1 to GSL3 and the string selection lines SSL1 to SSL3 may be separated. Even though not illustrated, the gate lines corresponding to the intermediate switching lines may be separated as will be described below. In FIG. 12, the memory block BLKi is illustrated to be coupled to eight gate lines GTL1 to GTL8 and three bit lines BL1 to BL3. However, example embodiments are not limited thereto. Each memory block in the memory cell array 100 may be coupled to any number of word lines and any number of bit lines.

Figure 13:
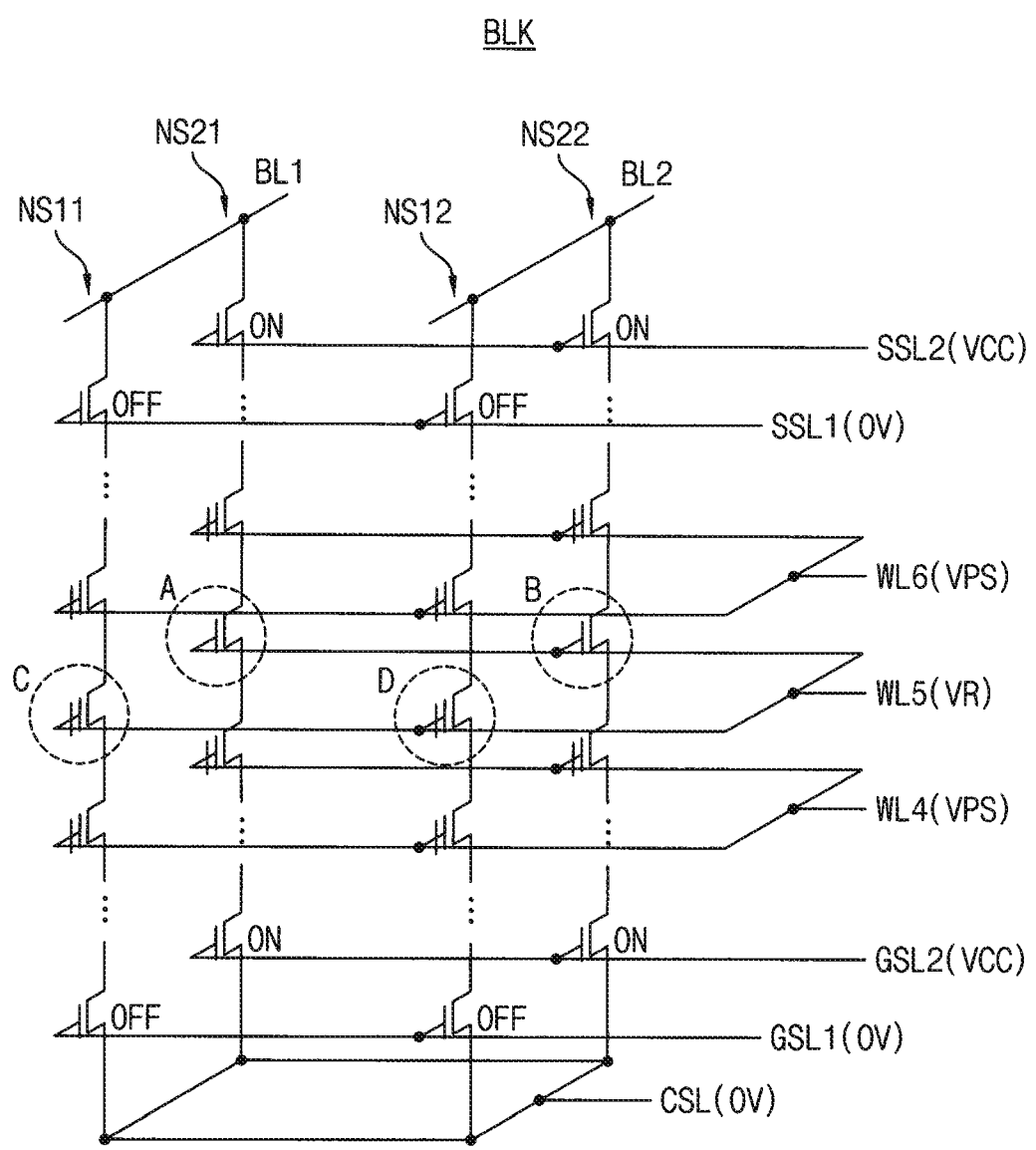
FIG. 13 is a circuit diagram illustrating an example read bias condition of a three-dimensional flash memory device.

FIG. 13 is a circuit diagram illustrating an example read bias condition of a three-dimensional flash memory device.

For convenience of description, NAND strings NS11 and NS21 connected to a first bit line BL1 and NAND strings NS12 and NS22 connected to a second bit line BL2 are illustrated in FIG. 13.

The first bit line BL1 and the second bit line BL2 may be pre-charged with a pre-charge voltage (e.g., 0.5 V). During a read operation, if NAND strings NS21 and NS22 are selected, a voltage of 0 V may be applied to the first string selection line SSL1 and a power supply voltage Vcc may be applied to the second string selection line SSL2. Furthermore, the voltage of 0 V may be applied to a first ground selection line GSL1 and the power supply voltage Vcc may be applied to a second ground selection line GSL2. A selection read voltage VR may be applied to a selected word line (e.g., WL5) and the non-selection read voltage VPS may be applied to unselected word lines (e.g., WL4 and WL6).

In this example read bias condition, the drain voltage of selected memory cells A and B is 0.5 V and the source voltage of selected memory cells A and B is 0 V. In addition, the selection read voltage VR is applied to gates of the selected memory cells A and B. Furthermore, a read operation for verifying data stored at a memory cell may be performed while changing a voltage level of the selection read voltage VR. Channels of unselected NAND strings NS11 and NS12 including memory cells C and D are floated. Specifically, the series connection of the memory transistors constituting the memory cells of each unselected NAND string (here, NS11 and NS12) is floated due to the corresponding string select transistor and gate select transistor being off. When the voltages of the word lines WL are increased (e.g., to the selection read voltage VR or the non-selection read voltage VPS), capacitive coupling between the word lines acts to increase the voltage of the channels of the unselected NAND strings NS11 and NS12.

According to example embodiments, the load of the selected word line WL5 may be reduced by synchronizing the voltage change of the adjacent word lines (e.g., WL4 and/or WL6) with the voltage change of the selected word line WL5. Here, the read operation may include the verification read operation for verifying the success of the program operation or the normal read operation for determining the data stored in the memory cells.

Figure 14:
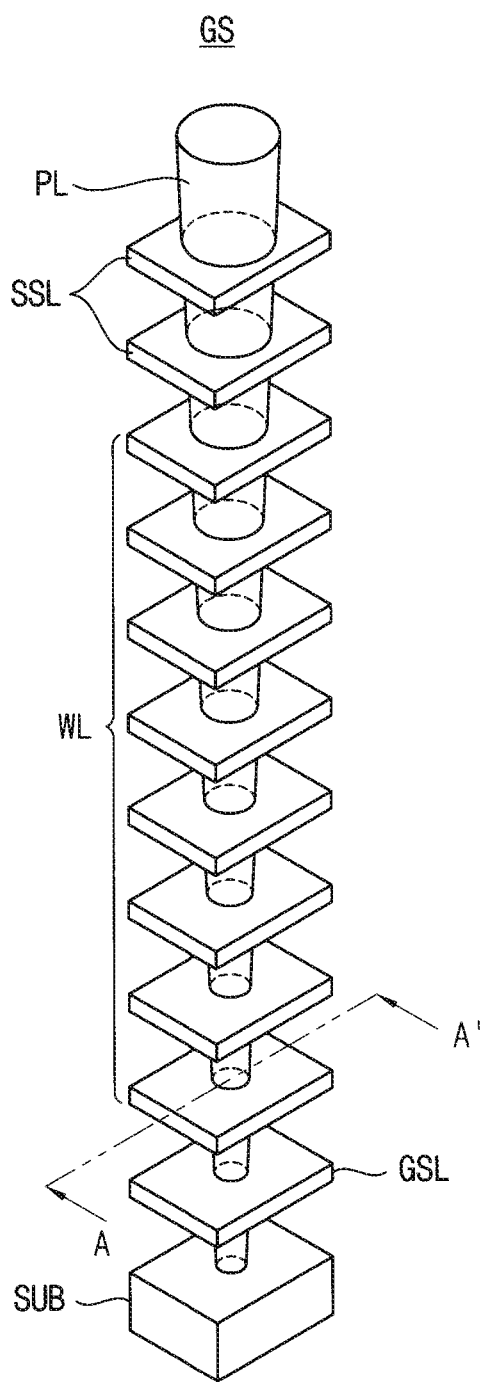
FIG. 14 is a diagram illustrating an example structure of a cell string.
Figure 15:
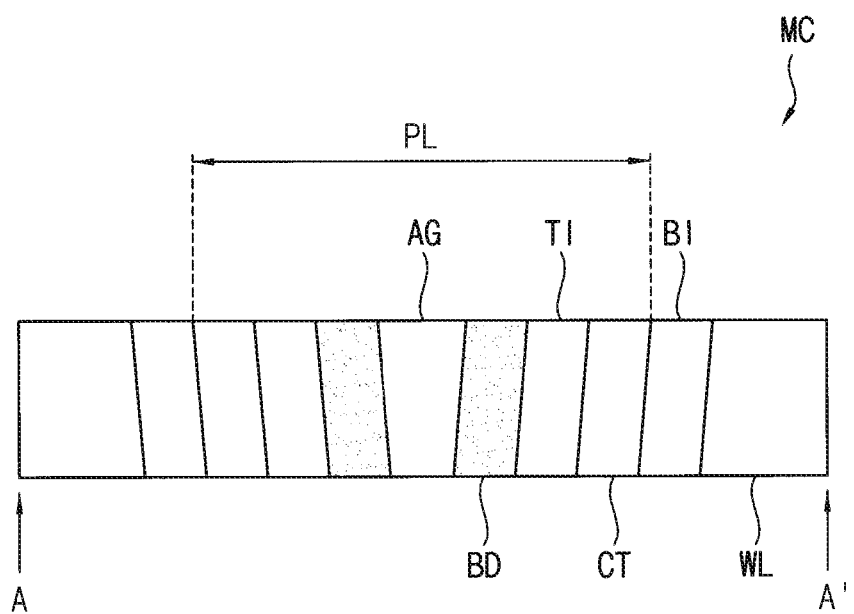
FIG. 15 is a diagram illustrating a memory cell included in the cell string of FIG. 15.

FIG. 14 is a diagram illustrating an example structure of a cell string, and FIG. 15 is a diagram illustrating a memory cell included in the cell string of FIG. 15.

Referring to FIGS. 11, 12, 14 and 15, a pillar PL extending in a vertical direction may be formed on a substrate SUB. The ground selection line GSL, the word lines WL and the string selection lines SSL illustrated in FIG. 15 may be formed conductive materials such as metals, which are parallel to the substrate SUB. The pillar PL may penetrate the conductive materials forming ground selection line GSL, the word lines WL and the string selection lines SSL to contact the substrate SUB. The word lines WL may include dummy word lines.

FIG. 15 illustrates a cross-sectional view cut along the line A-A' in FIG. 14. As an example, a cross-section of one memory cell MC corresponding to a word line is illustrated in FIG. 15. The pillar PL may include a body BD in a form of a cylinder, and an airgap AG may be provided in the body BD. The body BD may include silicon of a P-type and the body BD may be a region in which a channel if formed. The pillar PL may further include a tunnel insulation layer TI surrounding the body BD and a charge capturing layer CT surrounding the tunnel insulation layer T1. A blocking insulation layer BI may be provided between one word line and the pillar PL. The body BD, the tunnel insulation layer TI, the charge capturing layer CT, the blocking insulation layer BI and the one word line may form a transistor of a charge capturing type. In some example embodiments, the string selection transistor SST, the ground selection transistor GST and the other memory cells may have the same structure as illustrated in FIG. 15.

As illustrated in FIGS. 14 and 15, the width or the cross-section area of the pillar PL may be decreased as the distance to the substrate SUB is decreased. When the same voltage is applied to the bodies of the ground selection transistor GST, the memory cells MC and the string selection transistor SST, and the same voltage is applied to the ground selection line GLS, the word lines WL and the string selection line SSL, the electric field formed in the memory cell located near the substrate SUB is greater than the electric field formed in the memory cell located far from the substrate SUB. These characteristics affect the program disturbance during the program operation.

Figure 16:
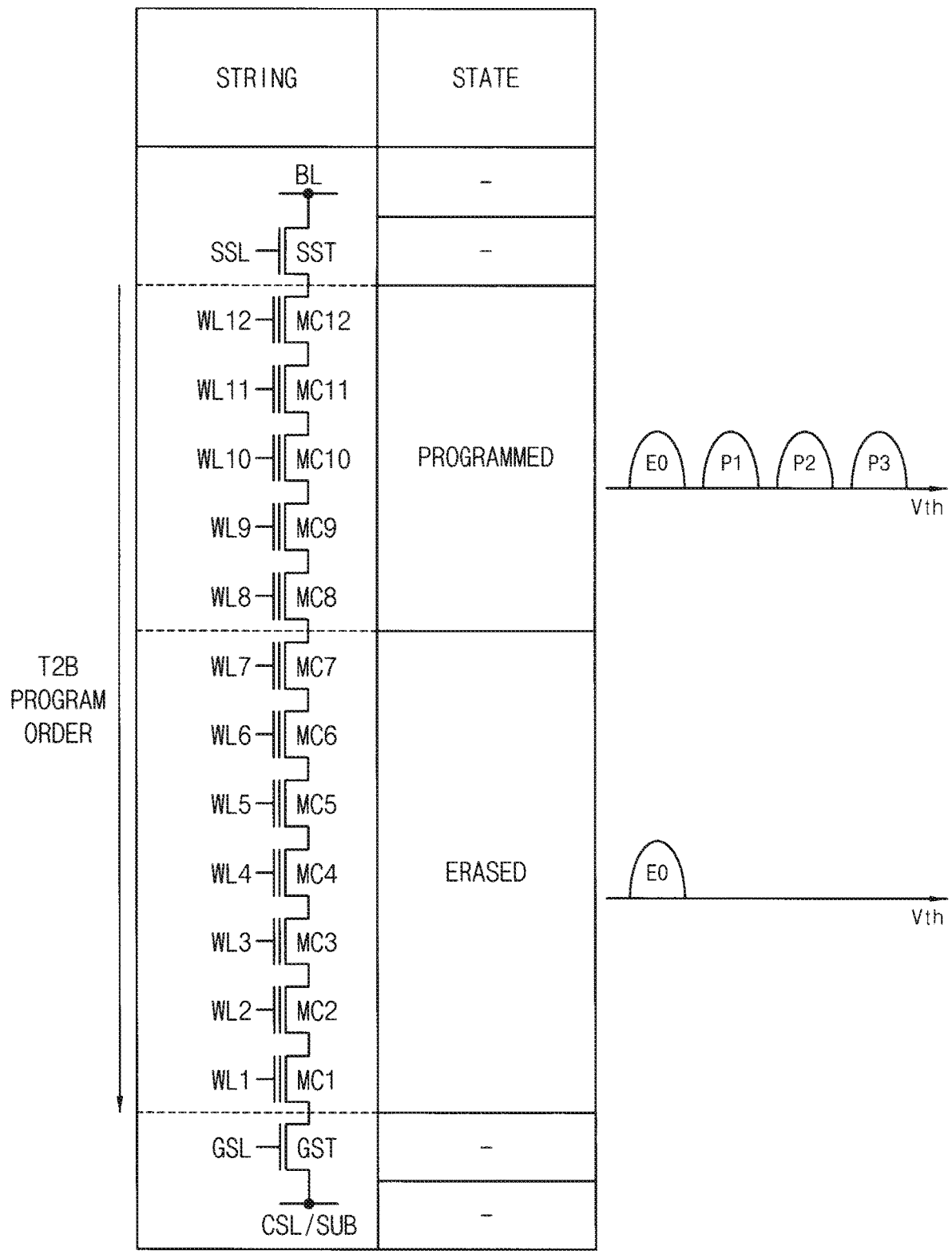
FIGS. 16 and 17 are diagrams illustrating a programming operation according to example embodiments.
Figure 17:
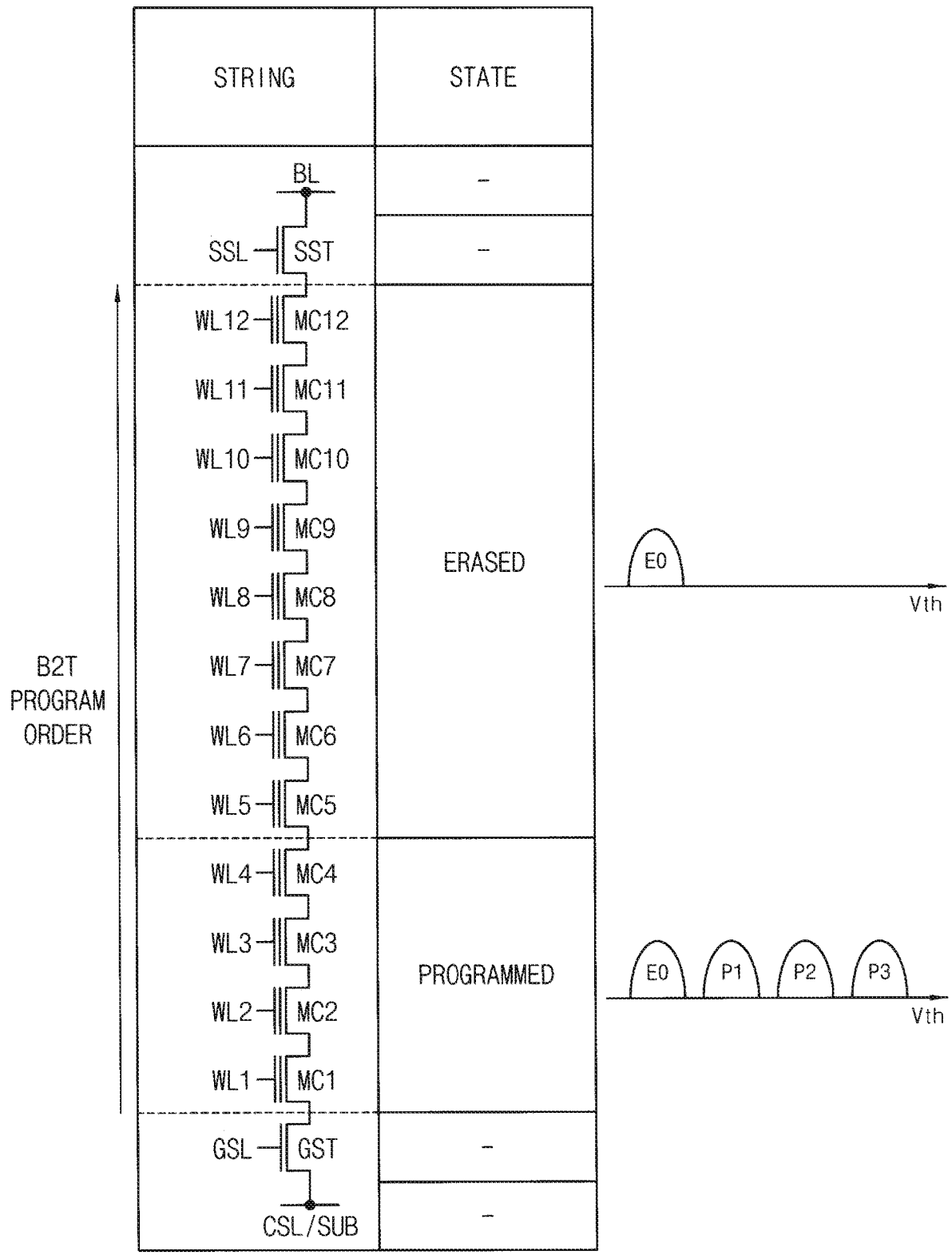

FIGS. 16 and 17 are diagrams illustrating a programming operation according to example embodiments.

FIGS. 16 and 17 illustrate one cell string including a string selection transistor SST connected to a string selection line SSL, a ground selection transistor GST connected to a ground selection line GSL and memory cells MC1~MC12 connected to word lines WL1~WL12 and states of memory cells. The cell string is connected between a bit line BL, a source line CSL and a substrate voltage SUB. FIGS. 16 and 17 illustrate a non-limiting example of twelve memory cells and an MLC storing two bits. The number of the word lines and the bit number in the memory cell may be determined variously.

Referring to FIG. 16, according to a program scenario of a nonvolatile memory device, a first program operation may be performed in a downward direction from an uppermost word line. In other words, as the data stored in the memory block increase, the data may be filled in erased cells in the downward direction from top to bottom (T2B program order). The not-programmed memory cells MC1~MC7 are in an erased state E0, and each of the programmed memory cells MC8~MC12 may be in one of the erased state E0 and programmed states P1, P2 and P3.

As described above with reference to FIG. 14, the three-dimensional NAND flash memory device is more vulnerable to the program disturbance as the size or the critical dimension (CD) of the channel hole is smaller. In case of a multiple level cell (MLC), the bit number programmed in each cell is increased. The number of the program loops is increased due to the increased number of the programmed states and thus the performance degradation due to the program disturbance is increased. Accordingly the program operation may be performed along the direction of a size decrease of the channel hole, that is, in the T2B program order as illustrated in FIG. 16.

Referring to FIG. 17, according to a program scenario of a nonvolatile memory device, a second program operation may be performed in an upward direction from a lowest word line. In other words, as the data stored in the memory block increase, the data may be filled in erased cells in the upward direction from bottom to top (B2T program order). The not-programmed memory cells MC5~MC12 are in an erased state E0, and each of the programmed memory cells MC1~MC4 may be in one of the erased state E0 and programmed states P1, P2 and P3.

Figure 18:
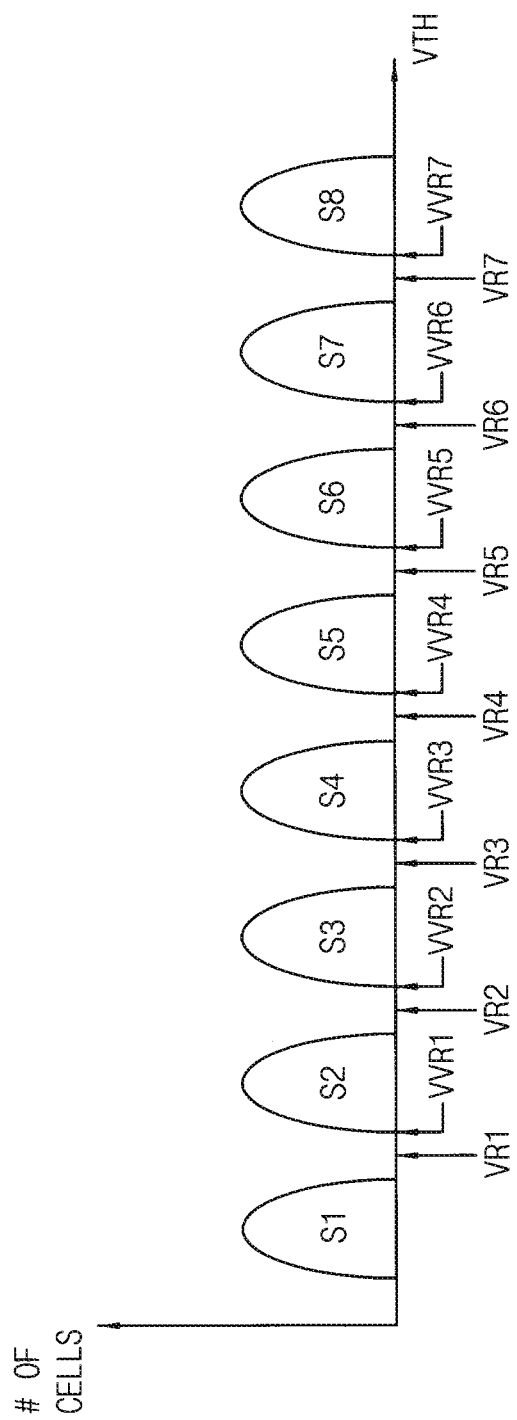
FIG. 18 is a diagram illustrating states of multi-level cells included in a nonvolatile memory device according to example embodiments.

FIG. 18 is a diagram illustrating states of multi-level cells included in a nonvolatile memory device according to example embodiments.

FIG. 18 illustrates first through eighth states S1~S8 of a triple level cell (TLC) memory where each memory cell of the TLC memory may store three data bits. In FIG. 14, the horizontal axis represents a threshold voltage VTH of memory cells and the vertical axis represents the number of the memory cells corresponding to the threshold voltage VTH. During the program operation, the program success of the first through eighth states S1~S8 may be distinguished by sequentially applying first through seventh verification read voltage VVR1~VVR7 to the selected word line. In addition, during the normal read operation, the first through eighth states S1~S8 may be distinguished by applying at least a portion of first through seventh normal read voltages VR1~VR7 to the selected word line as will be described below with reference to FIGS. 24 and 25.

FIGS. 19 through 23 are timing diagrams illustrating a method of operating a nonvolatile memory device according to example embodiments.

Figure 19:
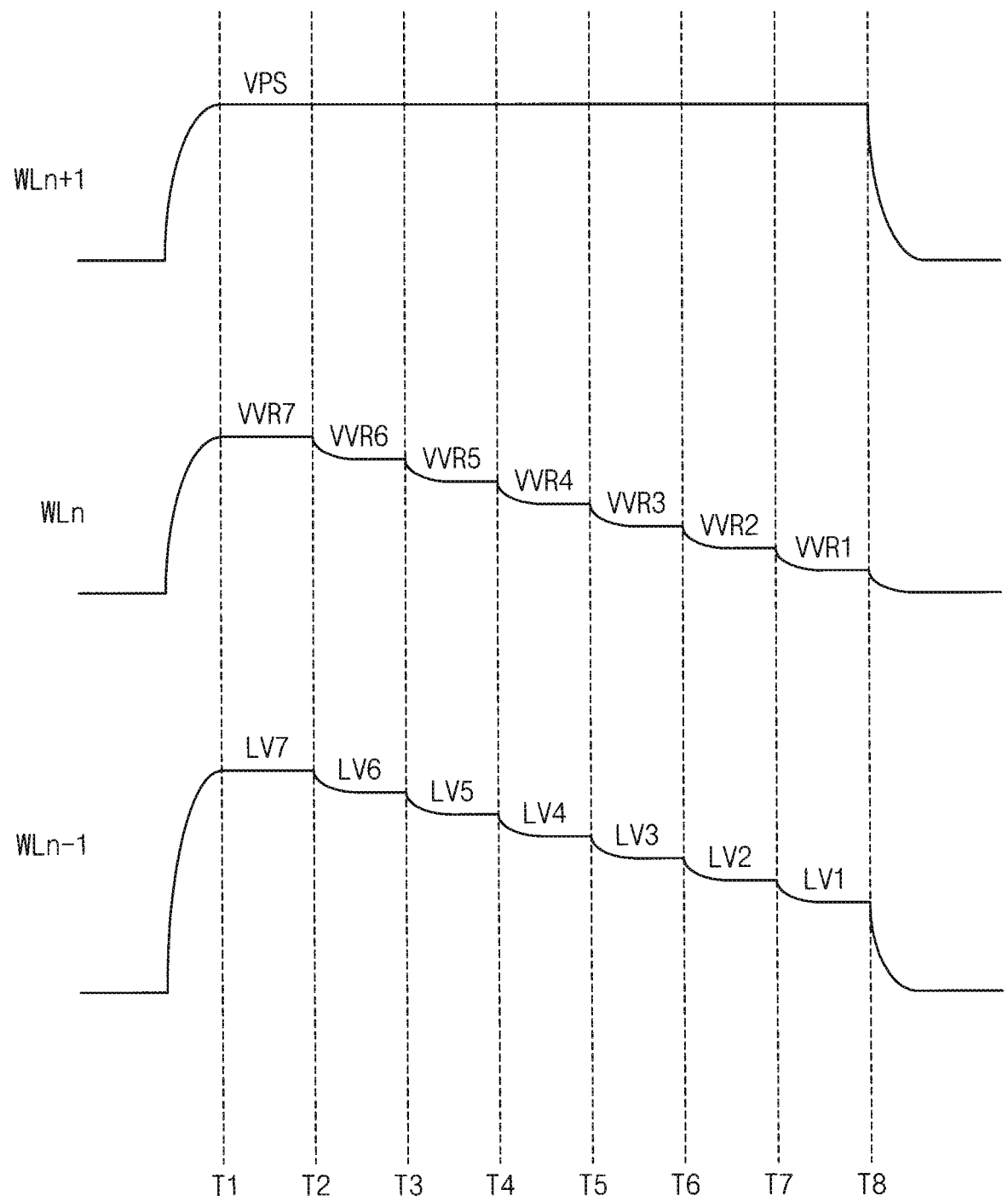
FIGS. 19 through 23 are timing diagrams illustrating a method of operating a nonvolatile memory device according to example embodiments.
Figure 20:
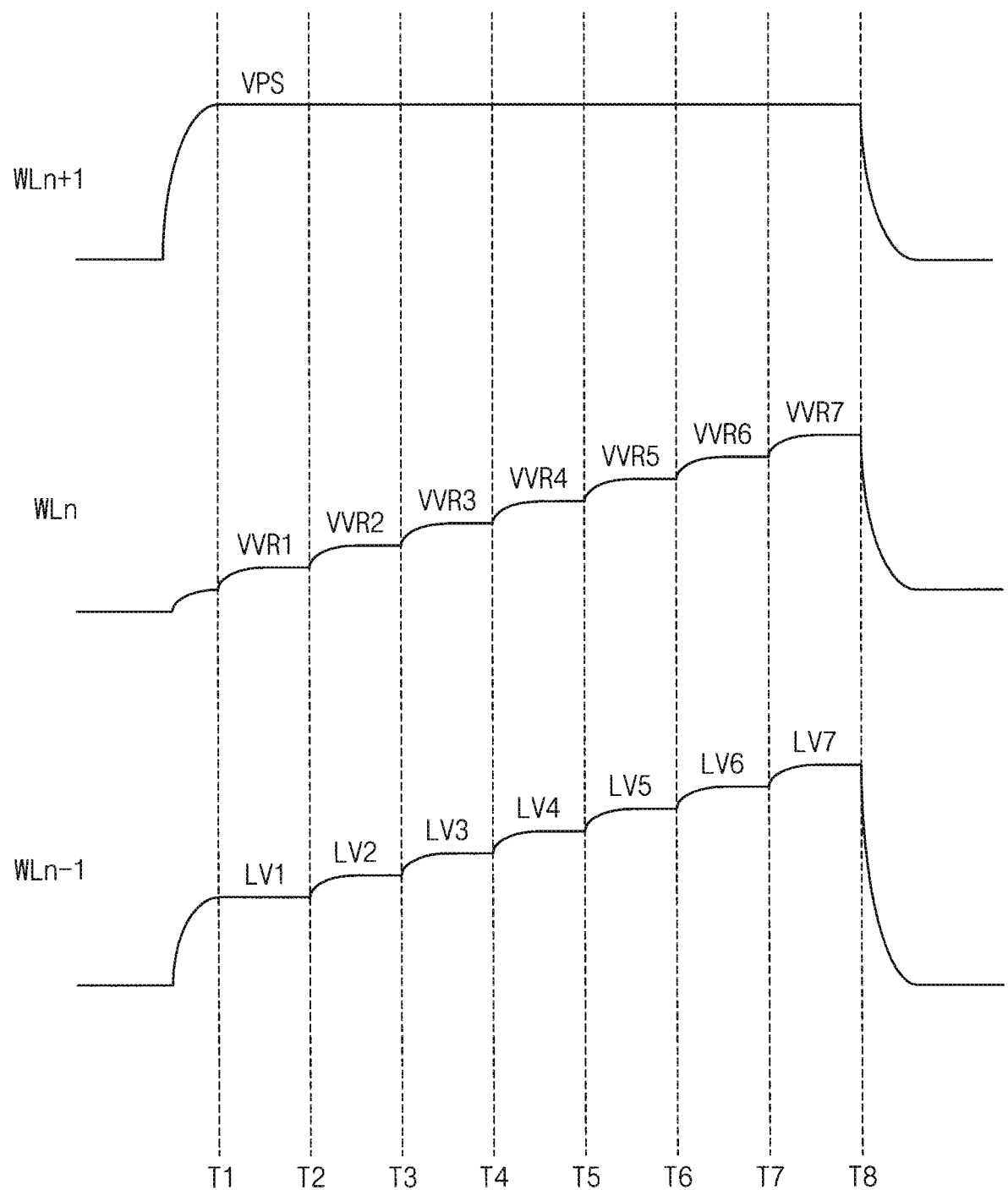
Figure 21:
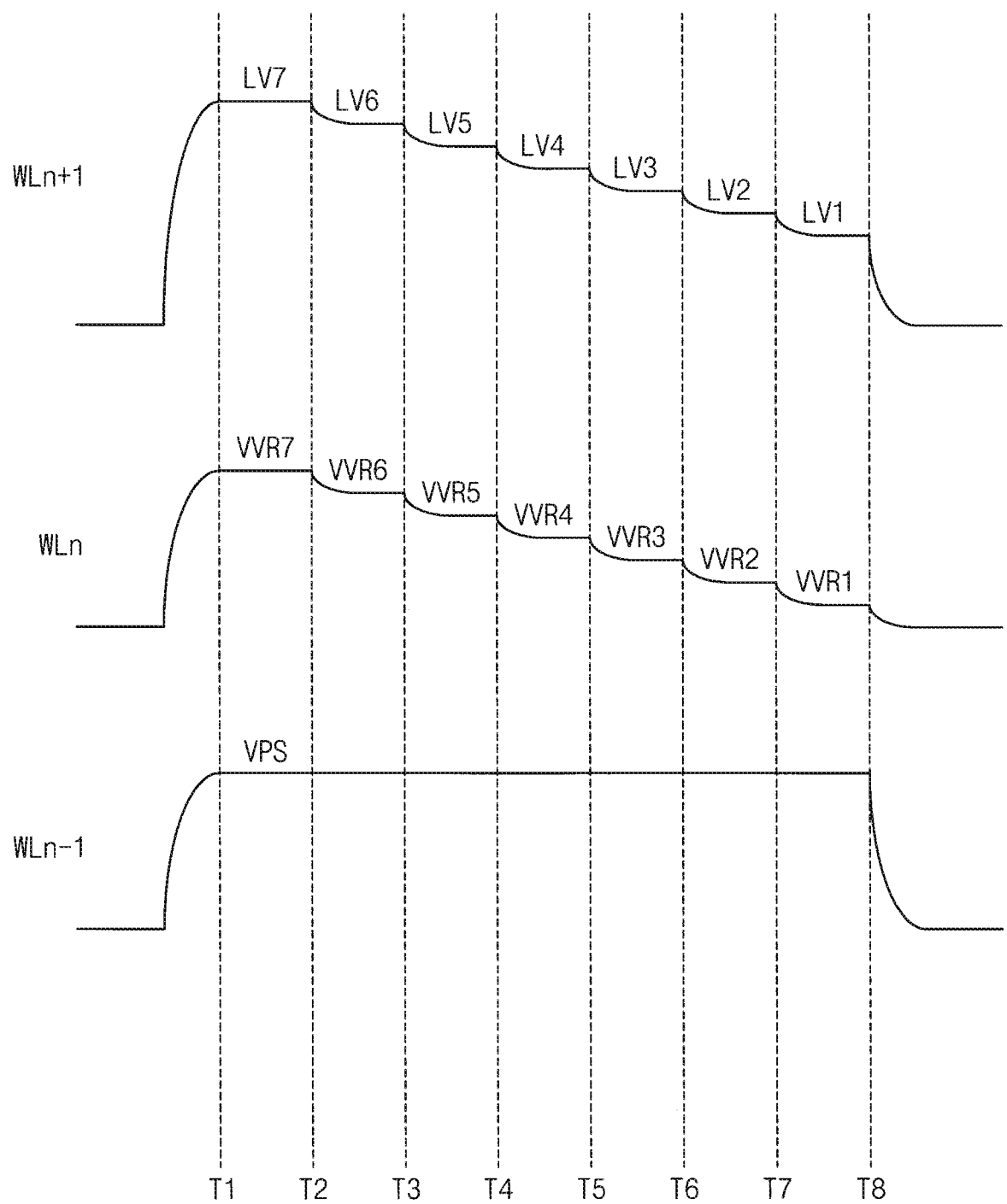

FIGS. 19, 20 and 21 illustrate example embodiments of an operation method during a program verification period with respect to the TLC of FIG. 18 in a vertical NAND flash memory device in which a plurality of word lines are stacked in a vertical direction. FIGS. 19 and 21 illustrate the first program operation of FIG. 16 that the plurality of word lines are programmed in the downward direction from the uppermost word line. FIG. 20 illustrates the second program operation of FIG. 17 that the plurality of word lines are programmed in the upward direction from the lowest word line.

Referring to FIG. 19, in the first program operation in the downward direction from the uppermost word line, the adjacent word line to which sequentially changing voltages are applied may include at least one lower adjacent word line WLn−1 under the selected word line WLn. The voltage of the selected word line WLn may be sequentially decreased such that the selected word line WLn may sequentially have the verification read voltages VVR1~VVR7 in the decreasing order to determine the threshold voltage states S1~S8 of the TLC of FIG. 18. According to example embodiments, in synchronization with the voltage change time points T2~T8 of the selected word line WLn, the voltage of the lower adjacent word line WLn−1 may be sequentially decreased such that the lower adjacent word line WLn−1 may sequentially have the voltage levels LV1~LV7 in the decreasing order. The voltage of the upper adjacent word line WLn+1 may maintain the pass voltage VPS as the other unselected word lines.

According to the first program operation, the multi-level cells connected to the lower adjacent word line WLn−1 are in the erased state, that is, the first state S1 in FIG. 18. Accordingly, the voltage of the lower adjacent word line WLn−1 is sequentially changed within a voltage range higher than a threshold voltage of the eased state S1 to turn on the multi-level cells connected to the lower adjacent word line WLn−1. In other words, the first voltage level LV1 in FIG. 19 may be set to be higher than the threshold voltage of the erased state S1.

According to the first program operation, the multi-level cells connected to the upper adjacent word line WLn+1 are in the programmed states, that is, the first through eighth states S1~S8 in FIG. 18. Accordingly, the upper adjacent word line WLn−1 has a voltage higher than a threshold voltage of the highest state S8 among the plurality of states S1~S8 to turn on the multi-level cells connected to the upper adjacent word line WLn+1. In other words, the pass voltage level VPS in FIG. 19 may be set to be higher than the threshold voltage of the highest state S8.

FIG. 20 is substantially the same as FIG. 19 except that the verification voltages VVR1~VVR7 applied to the selected word line WLn and the voltage levels LV1~LV7 applied to the lower adjacent word line WLn−1 are changed in the increasing order instead of the decreasing order, and thus the repeated descriptions are omitted.

Referring to FIG. 21, in the second program operation in the upward direction from the lowest word line, the adjacent word line to which sequentially changing voltages are applied may include at least one upper adjacent word line WLn+1 under the selected word line WLn. The voltage of the selected word line WLn may be sequentially decreased such that the selected word line WLn may sequentially have the verification read voltages VVR1~VVR7 in the decreasing order to determine the threshold voltage states S1~S8 of the TLC of FIG. 18. According to example embodiments, in synchronization with the voltage change time points T2~T8 of the selected word line WLn, the voltage of the upper adjacent word line WLn+1 may be sequentially decreased such that the upper adjacent word line WLn+1 may sequentially have the voltage levels LV1~LV7 in the decreasing order. The voltage of the lower adjacent word line WLn−1 may maintain the pass voltage VPS as the other unselected word lines.

According to the second program operation, the multi-level cells connected to the upper adjacent word line WLn+1 are in the erased state, that is, the first state S1 in FIG. 18. Accordingly, the voltage of the upper adjacent word line WLn+1 is sequentially changed within a voltage range higher than a threshold voltage of the eased state S1 to turn on the multi-level cells connected to the upper adjacent word line WLn+1. In other words, the first voltage level LV1 in FIG. 21 may be set to be higher than the threshold voltage of the erased state S1.

According to the second program operation, the multi-level cells connected to the lower adjacent word line WLn−1 are in the programmed states, that is, the first through eighth states S1~S8 in FIG. 18. Accordingly, the lower adjacent word line WLn−1 has a voltage higher than a threshold voltage of the highest state S8 among the plurality of states S1~S8 to turn on the multi-level cells connected to the lower adjacent word line WLn−1. In other words, the pass voltage level VPS in FIG. 21 may be set to be higher than the threshold voltage of the highest state S8.

Figure 22:
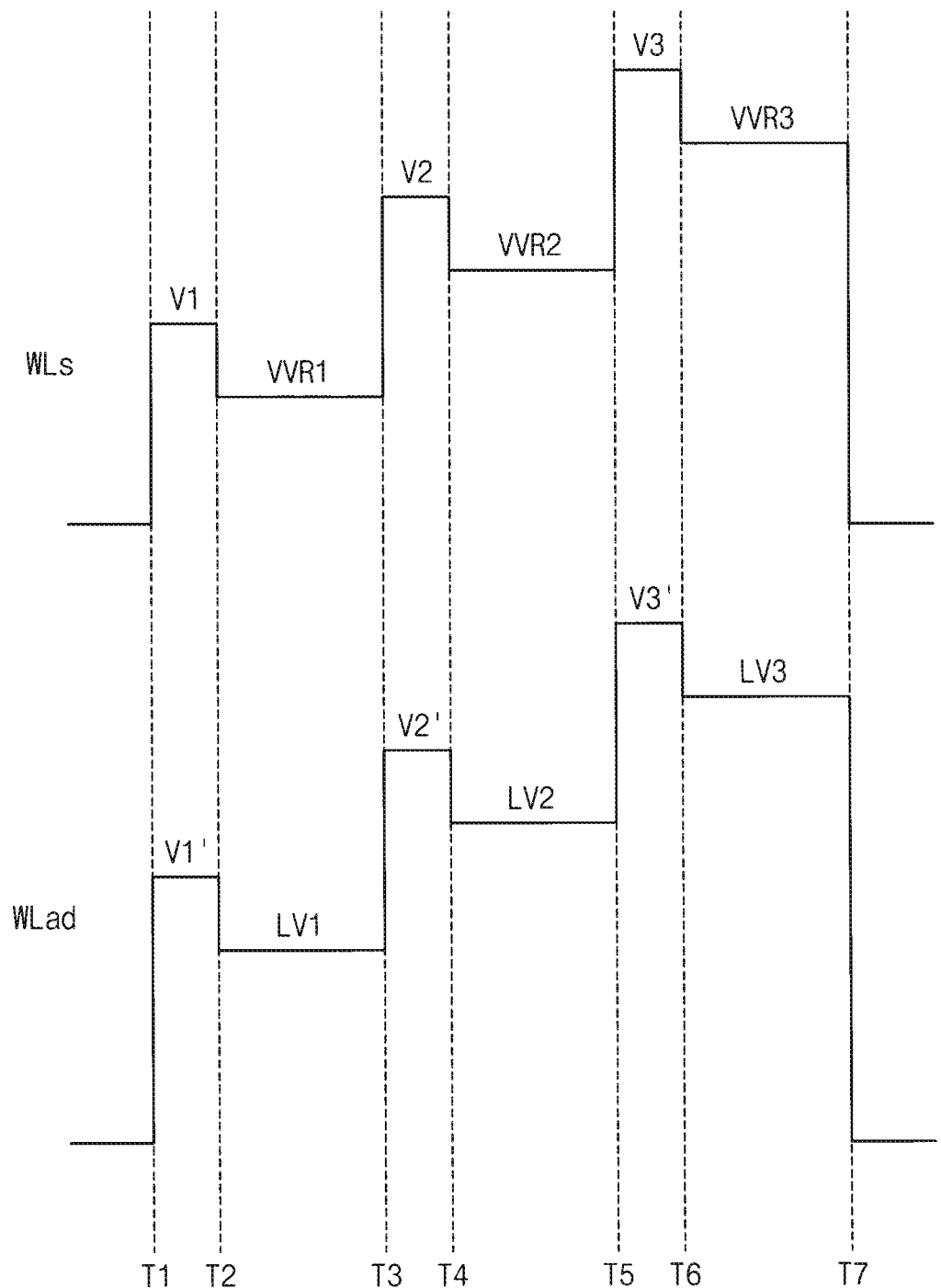
Figure 23:
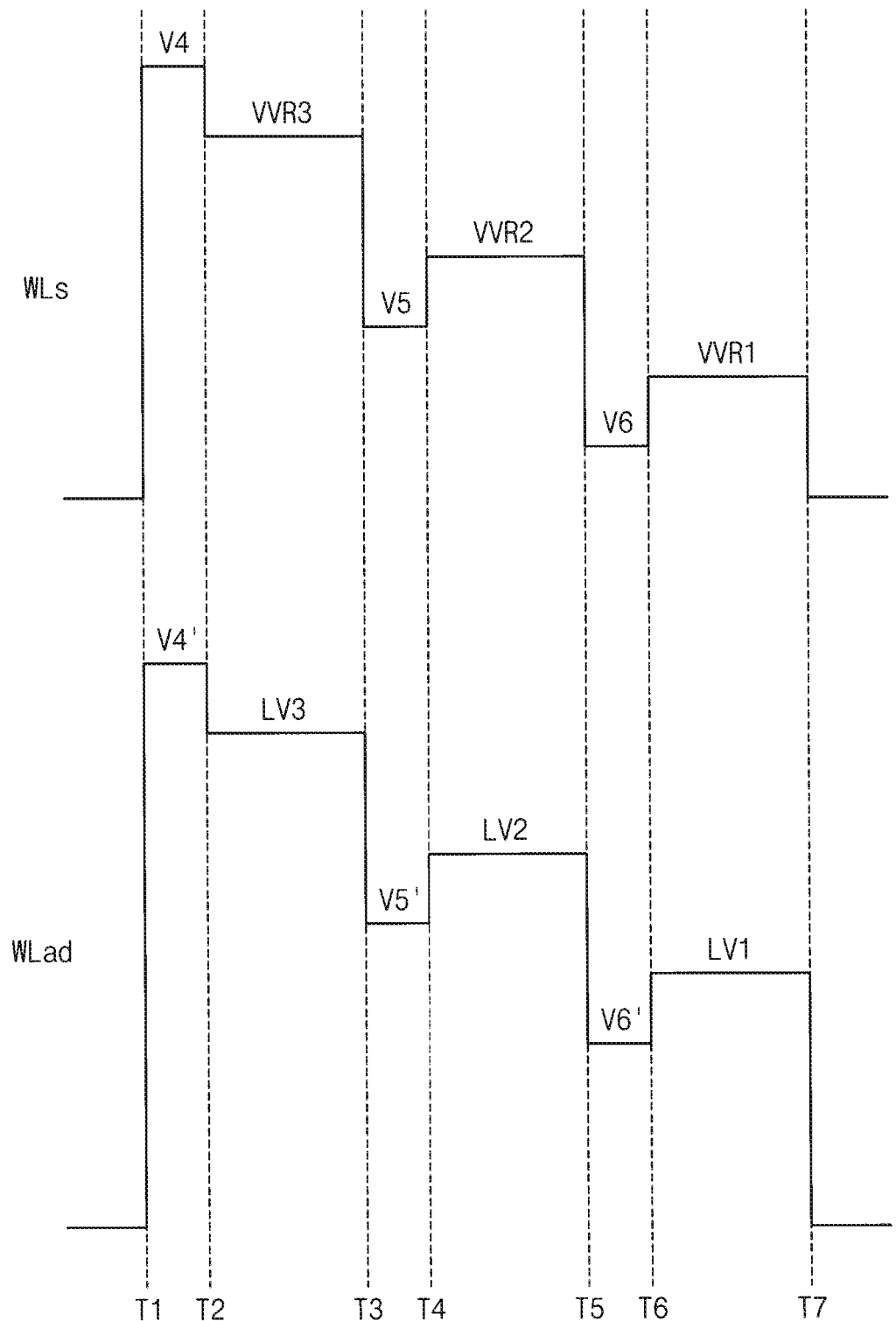

FIGS. 22 and 23 illustrate example embodiments of applying an offset pulse before applying the read voltage so as to further reduce the voltage setup time of the selected word line. The offset pulse may be applied in an initial period of changing the read voltage. The offset voltages applied to the selected word line WLs correspond to pulses V1~V6 in FIGS. 22 and 23, and the offset levels applied to the adjacent word line WLad correspond to pulses V1'~V6' in FIGS. 22 and 23. The verification read voltages VVR1, VVR2 and VVR3 applied to the selected word line WLn and the voltage levels LV1, LV2 and LV3 applied to the adjacent word line WLad are the same as described with reference to FIGS. 4 and 7.

Referring to FIG. 22, the voltage of the selected word line WLn may be increased from an L-th read voltage for an L-th sensing operation to an offset voltage, where L is a positive integer and the voltage of the selected word line WLn may be decreased from the offset voltage to an (L+1)-th read voltage for an (L+1)-th sensing operation, where the (L+1)-th read voltage is lower than the offset voltage and higher than the L-th read voltage. In synchronization with such voltage change of the selected word line WLn, the voltage of the adjacent word line WLad may be increased from an L-th voltage level to an offset level when the voltage of the selected word line WLn is increased from the L-th read voltage to the offset voltage and the voltage of the adjacent word line WLad may be decreased from the offset level to an (L+1)-th voltage level when the voltage of the selected word line WLn is decreased from the offset voltage to the (L+1)-th read voltage, where the (L+1)-th voltage level is lower than the offset level and higher than the L-th voltage level. For example, the voltage of the adjacent word line WLad may be increased from the first voltage level LV1 to the offset level V2' at the time point T3 when the voltage of the selected word line WLs is increased from the first verification read voltage VVR1 to the offset voltage V2, and the voltage of the adjacent word line WLad may be decreased from the offset level V2' to the second voltage level LV2 at the time point T4 when the voltage of the selected word line WLn is decreased from the offset voltage V2 to the second verification read voltage VVR2.

Referring to FIG. 23, the voltage of the selected word line WLn may be decreased from an (L+1)-th read voltage for an (L+1)-th sensing operation to an offset voltage, where L is a positive integer and the voltage of the selected word line WLn may be increased from the offset voltage to an L-th read voltage for an L-th sensing operation, where the L-th read voltage is higher than the offset voltage and lower than the (L+1)-th read voltage. In synchronization with such voltage change of the selected word line WLn, the voltage of the adjacent word line WLad may be decreased from an (L+1)-th voltage level to an offset level when the voltage of the selected word line WLn is decreased from the (L+1)-th read voltage to the offset voltage, and the voltage of the adjacent word line WLad may be increased from the offset level to an L-th voltage level when the voltage of the selected word line WLn is increased from the offset voltage to the L-th read voltage, where the L-th voltage level is higher than the offset level and lower than the (L+1)-th voltage level. For example, the voltage of the adjacent word line WLad may be decreased from the third voltage level LV3 to the offset level V5' at the time point T3 when the voltage of the selected word line WLs is decreased from the third verification read voltage VVR3 to the offset voltage V5, and the voltage of the adjacent word line WLad may be increased from the offset level V5' to the second voltage level LV2 at the time point T4 when the voltage of the selected word line WLn is increased from the offset voltage V5 to the second verification read voltage VVR2.

Figure 25:
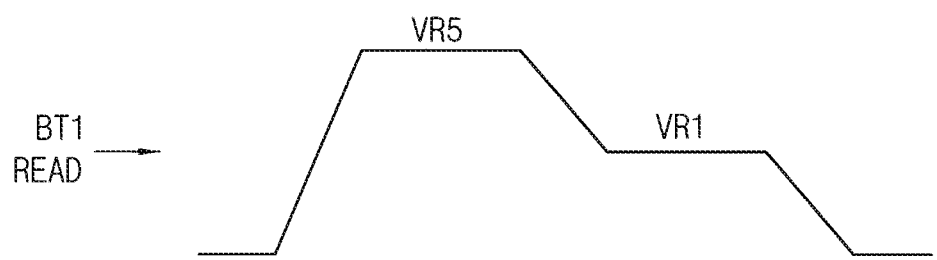
Figure 25:
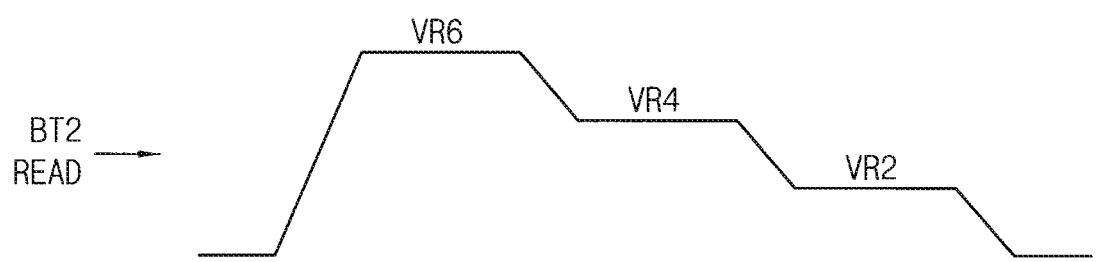
Figure 25:
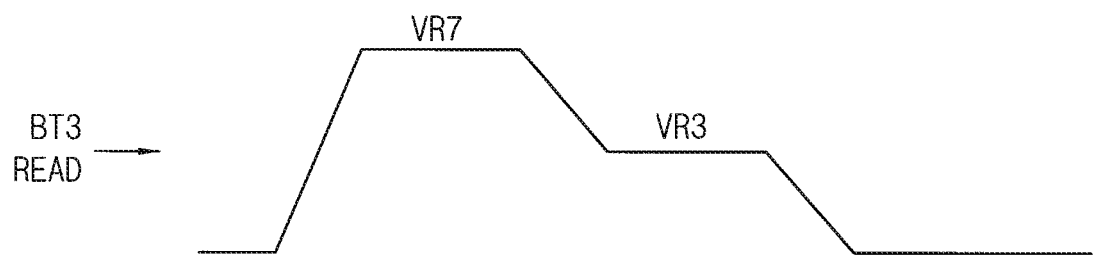

FIGS. 24 and 25 are diagrams illustrating a read sequence for a nonvolatile memory device according to example embodiments.

FIG. 24 illustrates an example of bit values corresponding to the first through eighth states S1~S8 in FIG. 18. The first through eighth states S1~S8 may be represented by 'BT3 BT2 BT1', that is, different values of first, second and third bits BT1, BT2 and BT3. For example, as illustrated in FIG. 15, the first state corresponds to '111', the second state corresponds to '110', the third state corresponds to '100', the fourth state corresponds to '000', the fifth state corresponds to '010', the sixth state corresponds to '011', the seventh state corresponds to '001', and the eighth state corresponds to '101'.

In this case, the first bit BT1 may be determined using the first read voltage VR1 and the fifth read voltage VR5, the second bit BT2 may be determined using the second read voltage VR2, the fourth read voltage V4 and the sixth read voltage VR6, and the third bit BT3 may be determined using the third read voltage VR3 and the seventh read voltage VR7.

FIG. 25 illustrates a high-to-low read sequence corresponding to the example of FIG. 15.

In case of reading the first bit BT1, the fifth read voltage VR5 may be applied to the selected word line for the first sensing operation and the first read voltage VR1 may be applied to the selected word line for the second sensing operation as described with reference to FIGS. 10 and 11.

In case of reading the second bit BT2, the sixth read voltage VR6, the fourth read voltage VR4 and the second read voltage VR2 may be applied sequentially to the selected word line for the first, second and third sensing operations as described with reference to FIGS. 12 and 13.

In case of reading the third bit BT3, the seventh read voltage VR7 and the third read voltage VR3 may be applied sequentially to the selected word line for the first and second sensing operations as described with reference to FIGS. 11 and 12.

Figure 26:
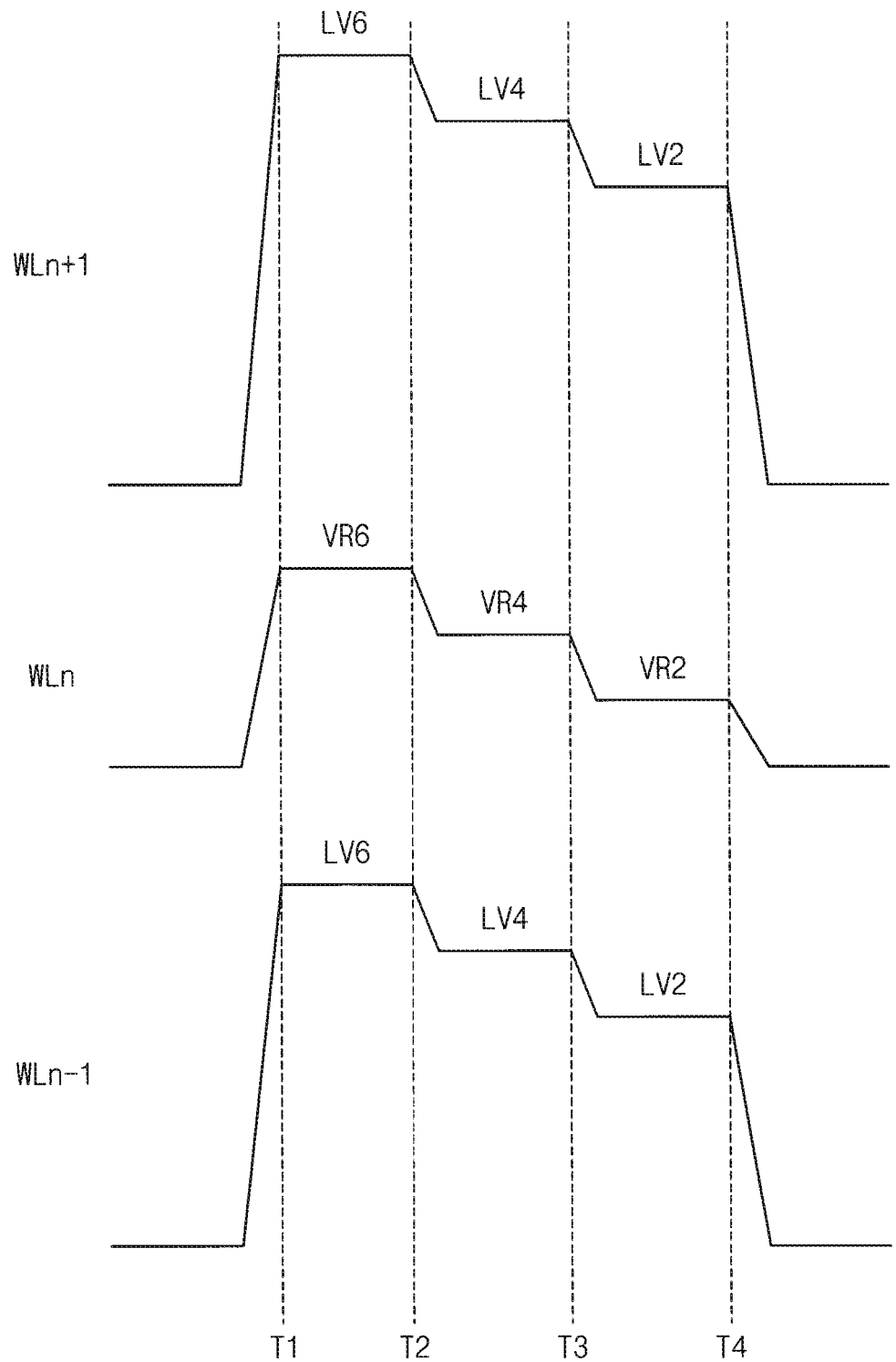
FIG. 26 is a timing diagram illustrating a method of operating a nonvolatile memory device according to example embodiments.

FIG. 26 is a timing diagram illustrating a method of operating a nonvolatile memory device according to example embodiments. FIG. 26 illustrates an example embodiment of an operation method corresponding to the reading operation of the second bit BT2 in FIG. 25.

Referring to FIG. 26, in the normal read operation, the voltage of the selected word line WLn may be sequentially changed such that the selected word line WLn may sequentially have the normal read voltages VR6, VR4 and VR2. In synchronization with the voltage change time points T1~T4 of the selected word line WLn, the voltage of the upper adjacent word line WLn+1 that is adjacent to the selected word line WLn in a first direction (that is, an upward direction) and the lower adjacent word line WLn−1 that is adjacent to the selected word line WLn in a second direction (that is, a downward direction) opposite to the first direction may be sequentially changed such that the adjacent word lines WLn+1 and WLn−1 sequentially have the voltage levels LV6, LV4 and LV2.

The multi-level cells connected to the adjacent word lines WLn+1 and WLn−1 may be in the programmed states, that is, the first through eighth threshold voltage states S1~S8 in FIG. 18. Accordingly, the voltage of the adjacent word lines WLn+1 and WLn−1 are sequentially changed within a voltage range higher than a threshold voltage of the highest state S8 among the threshold voltage states S1~S8 to turn on all of the multi-level cells connected to the adjacent word lines WLn+1 and WLn−1. In other words, the lowest voltage level VL2 in FIG. 26 may be set to be higher than the threshold voltage of the highest state S8.

Figure 27:
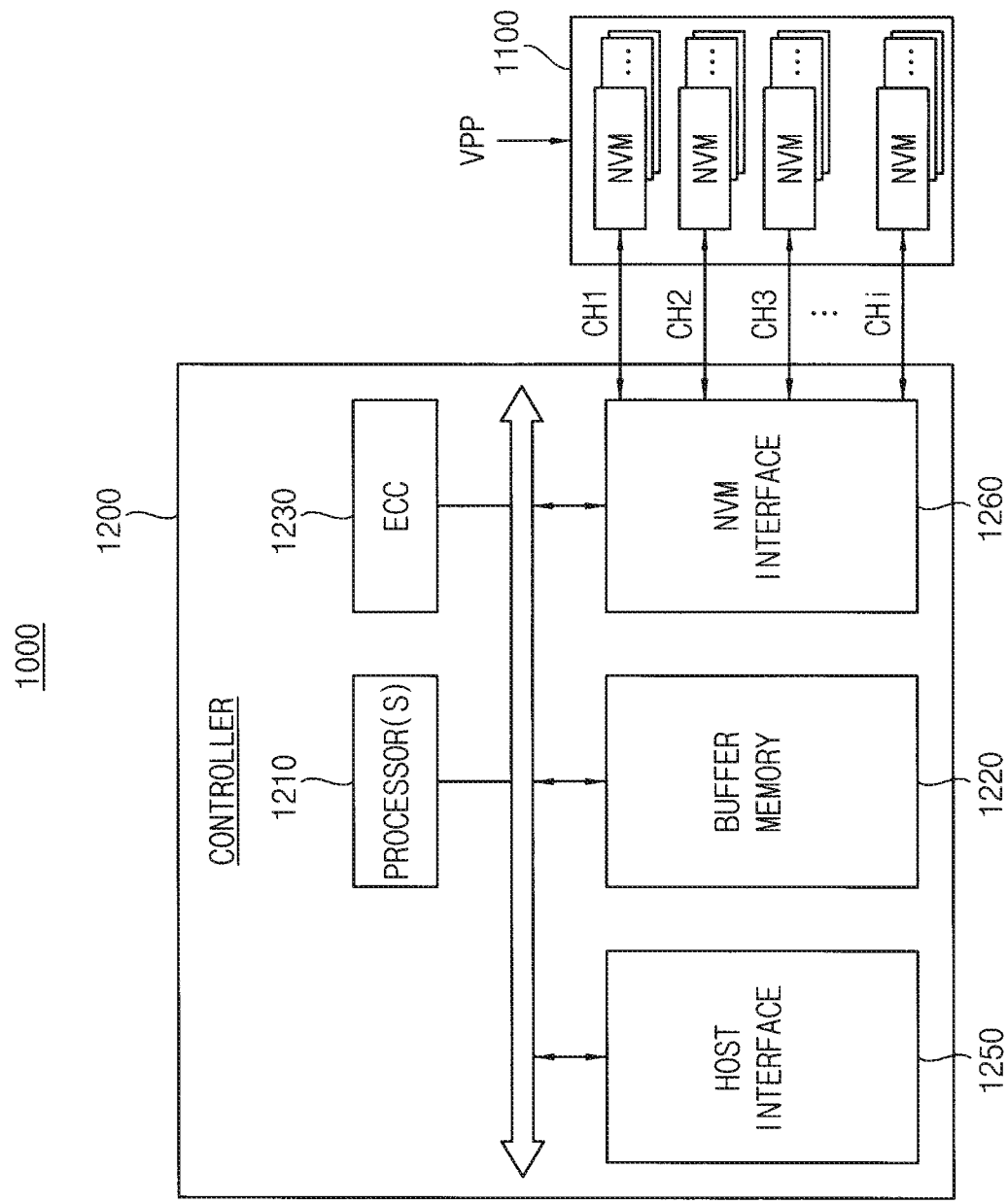
FIG. 27 is a block diagram illustrating a solid state disk or solid state drive (SSD) according to example embodiments.

FIG. 27 is a block diagram illustrating a solid state disk or solid state drive (SSD) according to example embodiments.

Referring to FIG. 27, an SSD 1000 includes multiple nonvolatile memory devices 1100 and an SSD controller 1200.

The nonvolatile memory devices 1100 may be configured optionally to receive a high voltage VPP. The nonvolatile memory devices 1100 may be the above-described memory devices disclosed above. According to example embodiments, the nonvolatile memory devices 1100 may synchronize voltage change timing of at least one adjacent word line with voltage change timing of a selected word line to reduce the load of the selected word line and increase the operation speed of the nonvolatile memory devices 1100.

The SSD controller 1200 is connected to the nonvolatile memory devices 1100 through multiple channels CH1 to CHi. The SSD controller 1200 includes one or more processors 1210, a buffer memory 1220, an error correction code (ECC) circuit 1230, a host interface 1250, and a nonvolatile memory interface 1260. The buffer memory 1220 stores data used to drive the SSD controller 1200. The buffer memory 1220 comprises multiple memory lines each storing data or a command. The ECC circuit 1230 calculates error correction code values of data to be programmed at a writing operation and corrects an error of read data using an error correction code value at a read operation. In a data recovery operation, The ECC circuit 1230 corrects an error of data recovered from the nonvolatile memory devices 1100.

The example embodiments of the inventive concepts may be applied to nonvolatile memory devices and systems including the nonvolatile memory device. For example, the example embodiments of the inventive concepts may be applied to systems such as be a memory card, a solid state drive (SSD), an embedded multimedia card (eMMC), a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

The units and/or devices described above, such as the components of the memory system (e.g., 10) including the memory controller (e.g., 20) and the nonvolatile memory device 30 as well as the sub-components thereof (e.g., the control circuit 450) may be implemented using hardware, a combination of hardware and software, or a non-transitory storage medium storing software that is executable to perform the functions of the same.

Hardware may be implemented with various hardware devices, such as integrated circuits (ICs), application specific ICs (ASICs), field programmable gate array (FPGAs), complex programmable logic device (CPLDs), system on chips (SoCs) or processing circuity such as one or more Central Processing Units (CPUs), one or more controllers, one or more arithmetic logic units (ALUs), one or more digital signal processors (DSPs), one or more microcomputers, or any other device or devices capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, etc., capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., one or more processors, CPUs, controllers, ALUs, DSPs, microcomputers, microprocessors, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor. In another example, the hardware device may be an integrated circuit customized into special purpose processing circuitry (e.g., an ASIC).

A hardware device, such as a computer processing device, may run an operating system (OS) and one or more software applications that run on the OS. The computer processing device also may access, store, manipulate, process, and create data in response to execution of the software. For simplicity, one or more example embodiments may be illustrated as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Software and/or data may be embodied permanently or temporarily in any type of storage media including, but not limited to, any machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including tangible or non-transitory computer-readable storage media as discussed herein.

Storage media may also include one or more storage devices at units and/or devices according to one or more example embodiments. The one or more storage devices may be tangible or non-transitory computer-readable storage media, such as random access memory (RAM), read only memory (ROM), a permanent mass storage device (such as a disk drive), and/or any other like data storage mechanism capable of storing and recording data. The one or more storage devices may be configured to store computer programs, program code, instructions, or some combination thereof, for one or more operating systems and/or for implementing the example embodiments described herein.

The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the storage media, the computer programs, program code, instructions, or some combination thereof, may be specially designed and constructed for the purposes of the example embodiments, or they may be known devices that are altered and/or modified for the purposes of example embodiments.

The foregoing is illustrative of example embodiments and is not to be construed as limiting thereof. Although a few example embodiments have been described, those skilled in the art will readily appreciate that many modifications are possible in the example embodiments without materially departing from the example embodiments of the inventive concepts.

What is claimed is:

1. A method of operating a nonvolatile memory device, the nonvolatile memory device including a plurality of cell strings, each of the plurality of cell strings including a plurality of multi-level cells, the method comprising:
   sequentially changing, at voltage changing time points, a voltage level of a selected word line to different ones of a plurality of read voltages; and
   sequentially changing a voltage level of an adjacent word line in synchronization with the voltage changing time points of the selected word line, the adjacent word line being adjacent to the selected word line.

2. The method of claim 1, wherein the sequentially changing the voltage level of the adjacent word line comprises:
   changing the voltage level of the adjacent word line in a same direction as a voltage level change direction of the selected word line such that a capacitance by capacitive coupling between the selected word line and the adjacent word line is decreased when determining threshold voltage states of the plurality of multi-level cells.

3. The method of claim 1, wherein
   the sequentially changing the voltage level of the selected word line includes decreasing the voltage level of the selected word line from an (L+1)-th read voltage for an (L+1)-th sensing operation to an L-th read voltage for an L-th sensing operation, the L-th read voltage being lower than the (L+1)-th read voltage, where L is a positive integer, and
   the sequentially changing the voltage level of the adjacent word line includes decreasing the voltage level of the adjacent word line from an (L+1)-th voltage level to an L-th voltage level in response to the voltage level of the selected word line being decreased from the (L+1)-th read voltage to the L-th read voltage, the L-th voltage level being lower than the (L+1)-th voltage level.

4. The method of claim 3, wherein the decreasing the voltage level of the adjacent word line decreases the voltage level of the adjacent word line such that a difference between the (L+1)-th read voltage level of the selected word line and the (L+1)-th voltage level of the adjacent word line is equal to a difference between the L-th read voltage of the selected word line and the L-th voltage level of the adjacent word line.

5. The method of claim 1, wherein
   the sequentially changing the voltage level of the selected word line includes increasing the voltage level of the selected word line from an L-th read voltage for an L-th sensing operation to an (L+1)-th read voltage for an (L+1)-th sensing operation, the (L+1)-th read voltage being higher than the L-th read voltage, where L is a positive integer, and the sequentially changing the voltage level of the adjacent word line includes increasing the voltage level of the adjacent word line from an L-th voltage level to an (L+1)-th voltage level, in response to the voltage level of the selected word line being increased from the L-th read voltage to the (L+1)-th read voltage, the (L+1)-th voltage level being higher than the L-th voltage level.

6. The method of claim 5, wherein the voltage level of the adjacent word line is increased such that a difference between the L-th read voltage of the selected word line and the L-th voltage level of the adjacent word line is equal to a difference between the (L+1)-th read voltage of the selected word line and the (L+1)-th voltage level of the adjacent word line.

7. The method of claim 1, wherein the plurality of read voltages correspond to a plurality of verification read voltages applied to the selected word line after a program voltage is applied to the selected word line during a program operation.

8. The method of claim 7, wherein ones of the plurality of multi-level cells connected to the adjacent word line are in an erased state.

9. The method of claim 8, wherein the sequentially changing the voltage level of the adjacent word line includes sequentially changing the voltage level of the adjacent word line within a voltage range higher than a threshold voltage of the erased state to turn on the ones of the plurality of multi-level cells connected to the adjacent word line.

10. The method of claim 7, wherein the nonvolatile memory device is a vertical NAND flash memory device, and the method further comprises:

performing the program operation in a downward direction from an uppermost word line with respect to a plurality of word lines of the vertical NAND flash memory device, wherein
the adjacent word line includes at least one word line under the selected word line.

11. The method of claim 7, the nonvolatile memory device is a vertical NAND flash memory device, and the method further comprises:

performing the program operation in an upward direction from a lowest word line with respect to a plurality of word lines of the vertical NAND flash memory device, wherein
the adjacent word line includes at least one word line above the selected word line.

12. The method of claim 1, wherein the sequentially changing the voltage level of the selected word line comprises:

increasing the voltage level of the selected word line from an L-th read voltage for an L-th sensing operation to an offset voltage, where L is a positive integer; and
decreasing the voltage level of the selected word line from the offset voltage to an (L+1)-th read voltage for an (L+1)-th sensing operation, the (L+1)-th read voltage being lower than the offset voltage and higher than the L-th read voltage.

13. The method of claim 12, wherein the sequentially changing the voltage level of the adjacent word line comprises:

increasing the voltage level of the adjacent word line from an L-th voltage level to an offset level in response to the voltage level of the selected word line being increased from the L-th read voltage to the offset voltage; and
decreasing the voltage level of the adjacent word line from the offset level to an (L+1)-th voltage level in response to the voltage level of the selected word line being decreased from the offset voltage to the (L+1)-th read voltage, the (L+1)-th voltage level being lower than the offset level and higher than the L-th voltage level.

14. The method of claim 1, wherein the sequentially changing the voltage level of the selected word line comprises:

decreasing the voltage level of the selected word line from an (L+1)-th read voltage for an (L+1)-th sensing operation to an offset voltage, where L is a positive integer; and
increasing the voltage level of the selected word line from the offset voltage to an L-th read voltage for an L-th sensing operation, the L-th read voltage being higher than the offset voltage and lower than the (L+1)-th read voltage.

15. The method of claim 14, wherein the sequentially changing the voltage of the adjacent word line comprises:

decreasing the voltage level of the adjacent word line from an (L+1)-th voltage level to an offset level in response to the voltage level of the selected word line being decreased from the (L+1)-th read voltage to the offset voltage; and
increasing the voltage level of the adjacent word line from the offset level to an L-th voltage level in response to the voltage level of the selected word line being increased from the offset voltage to the L-th read voltage, the L-th voltage level being higher than the offset level and lower than the (L+1)-th voltage level.

16. The method of claim 1, wherein the plurality of read voltages correspond to a plurality of normal read voltages applied to the selected word line during a normal read operation.

17. The method of claim 16, wherein the adjacent word line includes at least one word line adjacent to the selected word line in a first direction and at least one word line adjacent to the selected word line in a second direction, the second direction being opposite to the first direction.

18. The method of claim 16, wherein the sequentially changing the voltage level of the adjacent word line includes sequentially changing the voltage level of the adjacent word line within a voltage range higher than a threshold voltage of a highest state among the threshold voltage states to turn on all of the multi-level cells connected to the adjacent word line.

19. A nonvolatile memory device comprising:
at least one memory block including a plurality of cell strings, each of the plurality of cell strings including a plurality of multi-level cells; and
a control circuit configured to control a read operation such that,
a voltage level of a selected word line is sequentially changed, at voltage changing time points, to have different ones of a plurality of read voltages, and
a voltage level of an adjacent word line is sequentially changed in synchronization with the voltage changing time points of the selected word line, the adjacent word line being adjacent to the selected word line.

20. A method of operating a nonvolatile memory device, the nonvolatile memory device including a plurality of cell strings, each of the plurality of cell strings including a plurality of multi-level cells disposed in a vertical direction, the method comprising:

performing a program operation by applying a program voltage in one of a downward direction from an uppermost word line and an upward direction from a lowest word line;

sequentially changing, at voltage changing time points, a voltage level of a selected word line to different ones of a plurality of verification read voltages to determine threshold voltage states of the plurality of multi-level cells after the program voltage is applied to the selected word line; and sequentially changing a voltage level of an adjacent word line in synchronization with the voltage changing time points of the selected word line, the adjacent word line being adjacent in the downward direction or in the upward direction to the selected word line.

* * * * *